(12) United States Patent
Kobayashi

(10) Patent No.: US 7,688,272 B2
(45) Date of Patent: Mar. 30, 2010

(54) SEMICONDUCTOR DEVICE

(75) Inventor: Hidetomo Kobayashi, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 226 days.

(21) Appl. No.: 11/437,818

(22) Filed: May 22, 2006

(65) Prior Publication Data
US 2006/0267138 A1 Nov. 30, 2006

(30) Foreign Application Priority Data
May 30, 2005 (JP) ............................... 2005-158187

(51) Int. Cl.
*H01Q 21/20* (2006.01)
*H01Q 1/38* (2006.01)
(52) U.S. Cl. ...................... 343/800; 343/895; 343/893; 343/700 MS; 343/853
(58) Field of Classification Search .................. 343/800
See application file for complete search history.

(56) References Cited

U.S. PATENT DOCUMENTS

| | | | | |
|---|---|---|---|---|
| 3,699,452 | A * | 10/1972 | Lindenmeier et al. | 455/338 |
| 6,297,862 | B1 | 10/2001 | Murade | |
| 6,373,708 | B1 * | 4/2002 | Ando et al. | 361/737 |
| 7,160,786 | B2 * | 1/2007 | Kimura | 438/403 |
| 7,259,110 | B2 | 8/2007 | Ohnuma et al. | |
| 7,271,076 | B2 * | 9/2007 | Yamazaki et al. | 438/458 |
| 7,280,077 | B2 * | 10/2007 | Woo et al. | 343/703 |
| 2004/0164302 | A1 | 8/2004 | Arai et al. | |
| 2004/0256644 | A1 | 12/2004 | Kugler et al. | |
| 2005/0212707 | A1 * | 9/2005 | Egbert et al. | 343/702 |
| 2005/0287846 | A1 | 12/2005 | Dozen et al. | |
| 2006/0109176 | A1 * | 5/2006 | Lee et al. | 343/700 MS |
| 2006/0164312 | A1 * | 7/2006 | Mathieu | 343/748 |

(Continued)

FOREIGN PATENT DOCUMENTS

WO WO 2004/015778 2/2004

(Continued)

OTHER PUBLICATIONS

Nikkei Electronics, *Antenna Formed on IC of Tag Writing Capable at Distance of 40 CM Two Layers of Antenna Mixed on IC*, Apr. 11, 2005, pp. 26-27.

*Primary Examiner*—Trinh V Dinh
(74) *Attorney, Agent, or Firm*—Eric J. Robinson; Robinson Intellectual Property Law Office, P.C.

(57) ABSTRACT

An object is to provide a semiconductor device having an antenna structure which is advantageous for miniaturization, without changing the number of steps and communication distance. One feature to achieve the above object is a semiconductor device including a substrate, a tag portion including a thin film element formed over the substrate, a first antenna, and a second antenna, in which the first antenna and the second antenna are formed in different layers separated by an insulating film, the first antenna and the second antenna are partially electrically connected to each other, the first antenna is formed of a same material and in a same layer as a source or drain wiring connected to the thin film element, and the second antenna is formed in a different layer from the source or drain wiring connected to the thin film element.

34 Claims, 16 Drawing Sheets

U.S. PATENT DOCUMENTS

2007/0004100 A1  1/2007  Maekawa et al.
2007/0159353 A1  7/2007  Arai et al.
2007/0161159 A1  7/2007  Yamazaki et al.
2007/0176845 A1* 8/2007  Yamazaki et al. ........... 343/895

FOREIGN PATENT DOCUMENTS

WO    WO 2006/078065    7/2006

* cited by examiner

SEMICONDUCTOR DEVICE

BACKGROUND OF THE INVENTION

1. Field of the Invention

The present invention relates to a semiconductor device that can transmit and receive data by wireless communication. The present invention particularly relates to a semiconductor device that can transmit and receive data by wireless communication, which is advantageous for miniaturization.

2. Description of the Related Art

Because a semiconductor device that can transmit and receive data by wireless communication, which is mounted with an IC tag, such as a card type, a tag type, or a coin type has high information capacity and offers high-level security, the spread thereof has been advanced in the field of transportation, distribution, information, and the like. Further, a contactless IC tag device attracts attention because of having characteristics such as wireless data transmission, excellent reliability, and capability of processing plural pieces of data at a time.

The semiconductor device that can transmit and receive data by wireless communication may have a structure, for example, where covering materials formed of plastic or the like are attached to both sides of an IC module in which an antenna for power supply and data transmission and reception by electromagnetic coupling is connected to an external terminal of a tag.

The antenna of the semiconductor device that can transmit and receive data by wireless communication may be formed of copper foil or aluminum foil bonded to a plastic film and etched into a predetermined shape, conductive paste by printing, or the like.

The dimension of the semiconductor device that can transmit and receive data by wireless communication depends on applications. In general, an electromagnetic coupling type semiconductor device is electromagnetically coupled by changes in magnetic flux linking the antenna. Therefore, one with a small antenna area has a short communication distance and one with a large antenna area has a long communication distance.

As an example of applications of the semiconductor device that can transmit and receive data by wireless communication, a card, an index of a video tape or a CD box, or the like can be given.

In the case of using the antenna-mounted semiconductor device that can transmit and receive data by wireless communication, which is a vicinity type, power supply and data transmission and reception with respect to the semiconductor device are performed by electromagnetic coupling using an antenna 6502 for electromagnetic coupling as shown in FIG. 5. Note that the antenna 6502 is formed with an antenna forming layer 6503 and a tag 6500 is formed with a wiring forming layer 6501, as shown in FIG. 5.

Reference 1 describes the case of using an antenna divided into two layers in order to increase a communication distance. Specifically, resins are interposed between a Si substrate and a first layer of the antenna and between the first layer of the antenna and a second layer of the antenna, and the first layer and the second layer of the antenna are formed with a Cu wiring wound in a spiral shape (for example, see Reference 1: "Nikkei Electronics", Apr. 11, 2005 issue, p. 26-p. 27).

Under the present situation, the maximum output from an antenna of a reader/writer is set by the Radio Law. Since the semiconductor device that can transmit and receive data by wireless communication needs to receive the set output efficiently, the device preferably has as long an antenna as possible. Consequently, the size of the antenna is often larger than that of a circuit in the semiconductor device that can transmit and receive data by wireless communication. Various applications of the semiconductor device that can transmit and receive data by wireless communication are currently considered. Further expansion in application can be expected if the semiconductor device that can transmit and receive data by wireless communication can be reduced in size. For example, consider the case where the semiconductor device that can transmit and receive data by wireless communication is attached to a 1 cm square article to be managed. If the semiconductor device that can transmit and receive data by wireless communication is larger than a 1 cm square in the above case, it is considered detrimental to article management. If the semiconductor device that can transmit and receive data by wireless communication can be formed in a size that is not detrimental to article management, limitation due to size on the application of the semiconductor device that can transmit and receive data by wireless communication can be eliminated, which may lead to expansion in application of the semiconductor device that can transmit and receive data by wireless communication. In view of the above background, the problem is how to reduce antenna size without changing communication distance, in reducing the size of the semiconductor device that can transmit and receive data by wireless communication.

In order to solve the above problem, Reference 1 discloses a semiconductor device that can transmit and receive data by wireless communication, which includes two antenna layers. The problem at that time is that the number of steps is increased to form the two antenna layers, and accordingly throughput or yield is decreased.

SUMMARY OF THE INVENTION

In view of the above description, it is an object of the present invention to provide a semiconductor device having an antenna structure which is advantageous for miniaturization, without changing the number of steps and communication distance.

One feature of the present invention to achieve the above object is a semiconductor device including a substrate, a tag portion including a circuit including a thin film element formed over the substrate, a first antenna, and a second antenna, in which the first antenna and the second antenna are formed in different layers separated by an insulating film, the first antenna and the second antenna are partially electrically connected to each other, the first antenna is formed of a same material and in a same layer as a source or drain wiring connected to the thin film element, and the second antenna is formed in a different layer from the source or drain wiring connected to the thin film element.

Another feature of the present invention to achieve the above object is a semiconductor device including a substrate, a tag portion including a thin film element formed over the substrate, a first antenna, and a second antenna, in which the first antenna and the second antenna are formed in different layers separated by an insulating film, the first antenna and the second antenna are partially electrically connected to each other, the first antenna is formed of a same material and in a same layer as a source or drain wiring connected to the thin film element, the second antenna is formed in a different layer from the source or drain wiring connected to the thin film element, and the first antenna and the second antenna are formed so as not to overlap each other except in an intersecting portion and an electrically connecting portion when seen from a direction perpendicular to the substrate.

Another feature of the present invention to achieve the object is a semiconductor device according to the above feature, in which the thin film element includes a thin film transistor including a semiconductor layer, a gate insulating film, and a gate electrode, the tag portion is electrically connected to the first antenna, and a wiring connecting the tag portion and the first antenna is formed of the same material and in the same layer as the gate electrode of the thin film transistor.

Another feature of the present invention is a semiconductor device according to the above feature, in which the gate electrode is formed using at least one selected from the group consisting of tantalum, tungsten, titanium, molybdenum, aluminum, copper, chromium, and niobium or an alloy or a compound containing one or a plurality of them.

Another feature of the present invention is a semiconductor device according to the above feature, in which the first antenna is formed using at least one selected from the group consisting of aluminum, nickel, tungsten, molybdenum, titanium, platinum, copper, tantalum, gold, and manganese or an alloy or a compound containing one or a plurality of them.

Another feature of the present invention is a semiconductor device according to the above feature, in which the second antenna is formed using at least one selected from the group consisting of aluminum, nickel, tungsten, molybdenum, titanium, platinum, copper, tantalum, gold, and manganese or an alloy or a compound containing one or a plurality of them.

The semiconductor device of the present invention is a semiconductor device that can transmit and receive data by wireless communication, which can be miniaturized without changing the number of steps and communication distance. The semiconductor device of the present invention can also increase communication distance without changing its size. The semiconductor device of the present invention can be miniaturized or can increase communication distance without changing its size, and can suppress decreases in yield and throughput as well. Moreover, the semiconductor device of the present invention can be miniaturized or can increase communication distance without changing its size, and can suppress an increase in manufacturing cost as well.

DETAILED DESCRIPTION OF THE INVENTION

Hereinafter, embodiment modes and embodiments of the present invention are explained with reference to the drawings. However, the present invention is not limited to the following description. As is easily known to a person skilled in the art, the mode and the detail of the invention can be variously changed without departing from the spirit and the scope of the present invention. Thus, the present invention is not interpreted while limiting to the following description of the embodiment modes and the embodiments.

Embodiment Mode 1

Figure 1:
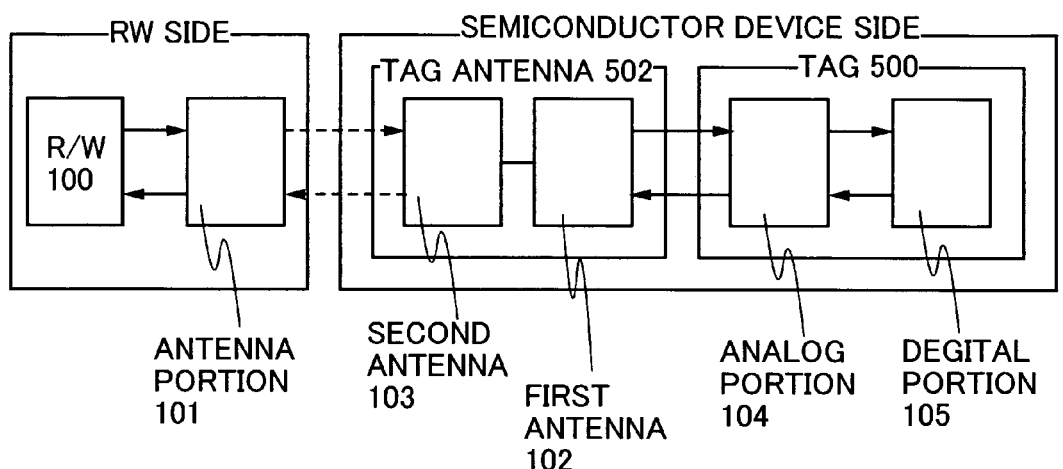
FIG. 1 is a block diagram showing a structure of a semiconductor device of the present invention.

An embodiment mode of the present invention is explained with reference to drawings. FIG. 1 is a diagram showing an example of a structure of a semiconductor device that can exchange data without contact. The semiconductor device that can transmit and receive data by wireless communication is also referred to as an RFID (Radio Frequency Identification) tag, an ID tag, an IC tag, an IC chip, an RF (Radio Frequency) tag, a wireless tag, an electronic tag, or a wireless chip depending on its application mode. In the present invention, it is referred to as an RFID tag for convenience, but it can be applied to any of the above modes. The semiconductor device that can transmit and receive data by wireless communication communicates data and transmits and receives power between an antenna portion 101 of a read/write communication control circuit 100 (hereinafter referred to as a reader/writer or R/W) and a tag antenna 502 of the semiconductor device that can transmit and receive data by wireless communication and that includes a communication control circuit. The semiconductor device that can transmit and receive data by wireless communication includes the tag antenna 502 and a tag 500 which generates a power supply voltage and a demodulated signal from an electric wave received by the tag antenna 502 and controls communication. The tag antenna 502 includes a first antenna 102 and a second antenna 103. The tag 500 includes an analog portion 104 which mainly generates a power supply voltage and demodulates and modulates a signal, and a digital portion 105 which analyzes signals and generates transmission data using the power supply voltage and the demodulated signal generated by the analog portion 104.

Figure 2:
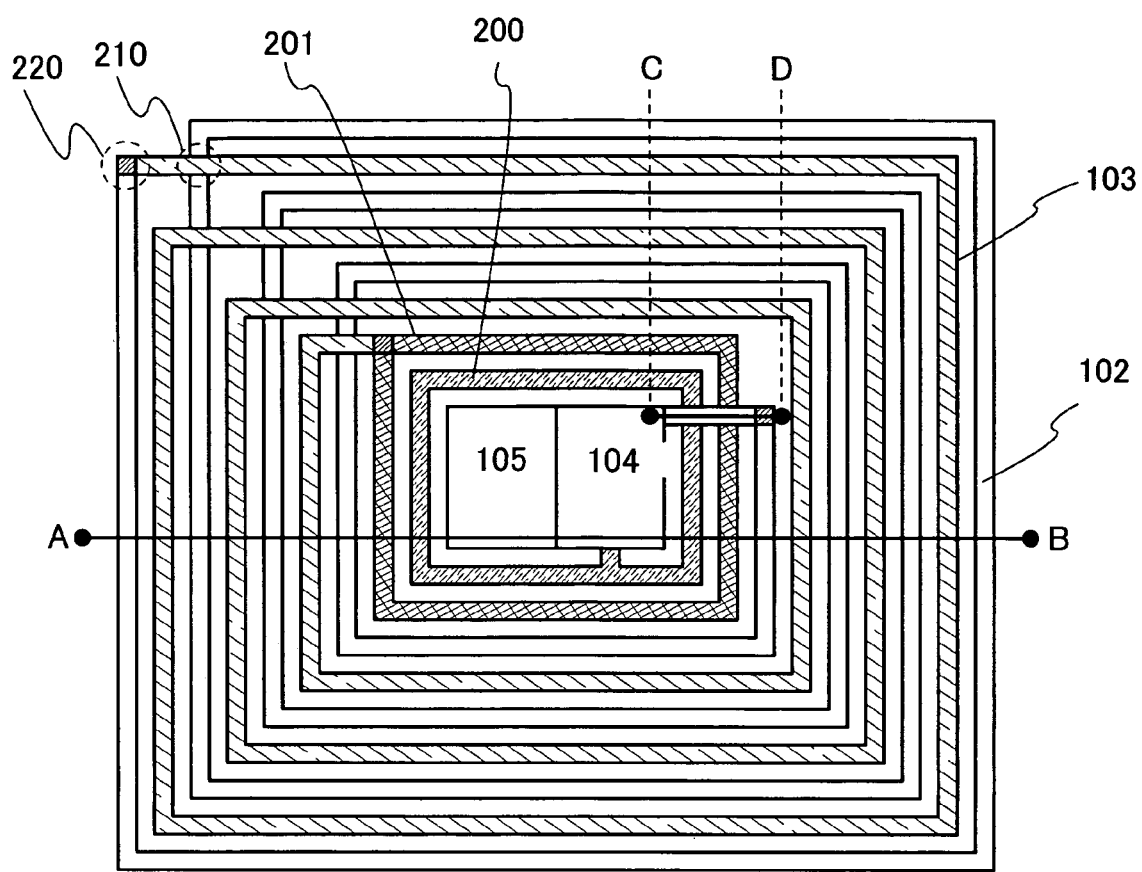
FIG. 2 is a plan view of a semiconductor device of the present invention.
Figure 6:
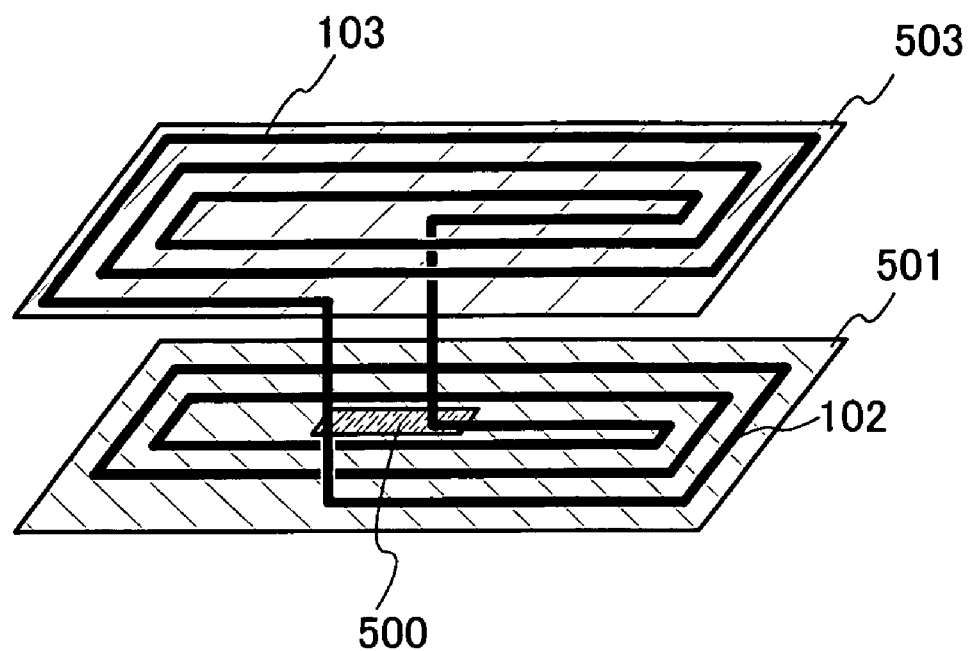
FIG. 6 is a diagram showing one embodiment mode of a semiconductor device of the present invention.

FIG. 2 is a top view of the semiconductor device of the present invention that can transmit and receive data by wireless communication. A VDD wiring 200 and a GND wiring 201 are arranged to surround the analog portion 104 and the digital portion 105 in order to stably supply a power supply potential (VDD) and a reference potential (GND) to the entire tag 500. The analog portion 104 is electrically connected to one end of the first antenna 102. The other end of the first antenna 102 is electrically connected to one end of the second antenna 103. The other end of the second antenna 103 is electrically connected to the GND wiring 201. In addition, as shown in FIG. 6, the first antenna 102 is manufactured with a wiring forming layer 501 of the tag 500 and the second antenna 103 is manufactured with an antenna forming layer 503, separately. Accordingly, an antenna having a two-layer structure can be manufactured without increasing the number of steps. By forming a wiring with two layers and connecting the layers, inductance equivalent to that of a large size antenna can be generated, and a longer communication distance than that of the same-size antenna with a wiring of a single layer can be obtained. On the other hand, the size can be reduced in the case of manufacturing an antenna having the same communication distance.

Figure 7:
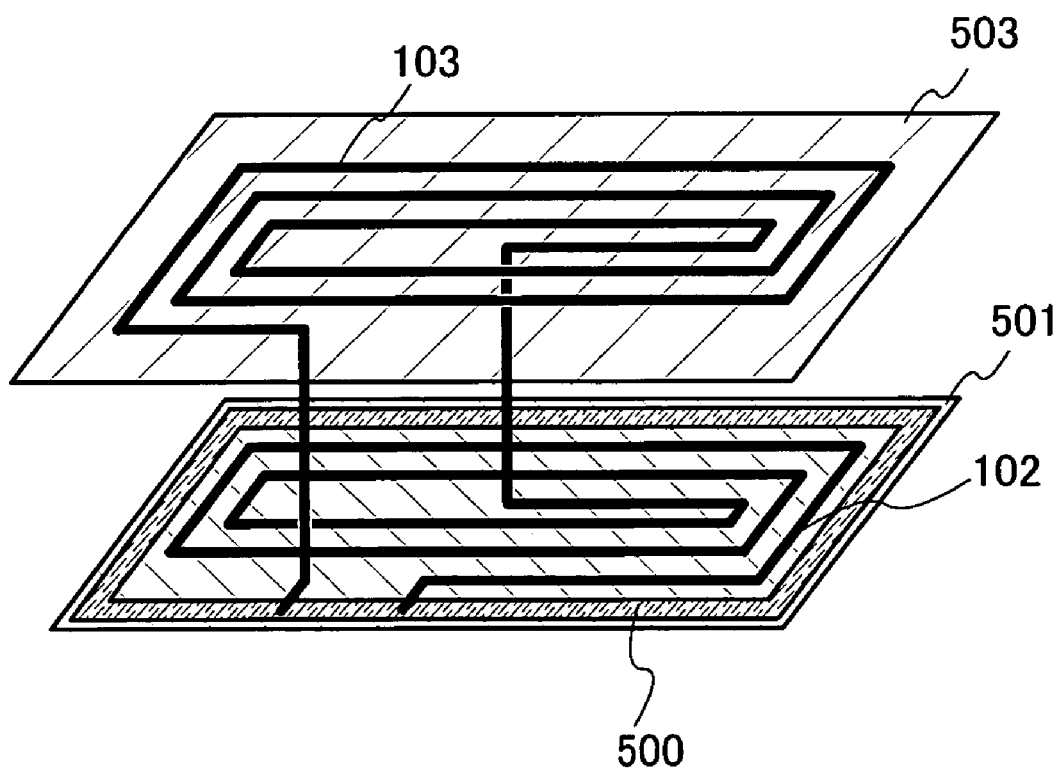
FIG. 7 is a diagram showing one embodiment mode of a semiconductor device of the present invention.

As for the positional relationship between the first antenna 102 and the tag 500 manufactured in the wiring forming layer 501, the first antenna 102 may be arranged to surround the tag 500 as shown in FIG. 6, or the tag 500 may be arranged outside the first antenna 102 as shown in FIG. 7. Further, the positional relationship between the tag 500 and the antenna is not limited to those described above, and can be freely arranged unless it deviates from the spirit of the invention. With the structure in which the tag is arranged outside the antenna as shown in FIG. 7, the influence of magnetic flux, which passes inside the antenna, on the tag can be decreased.

Figure 3:
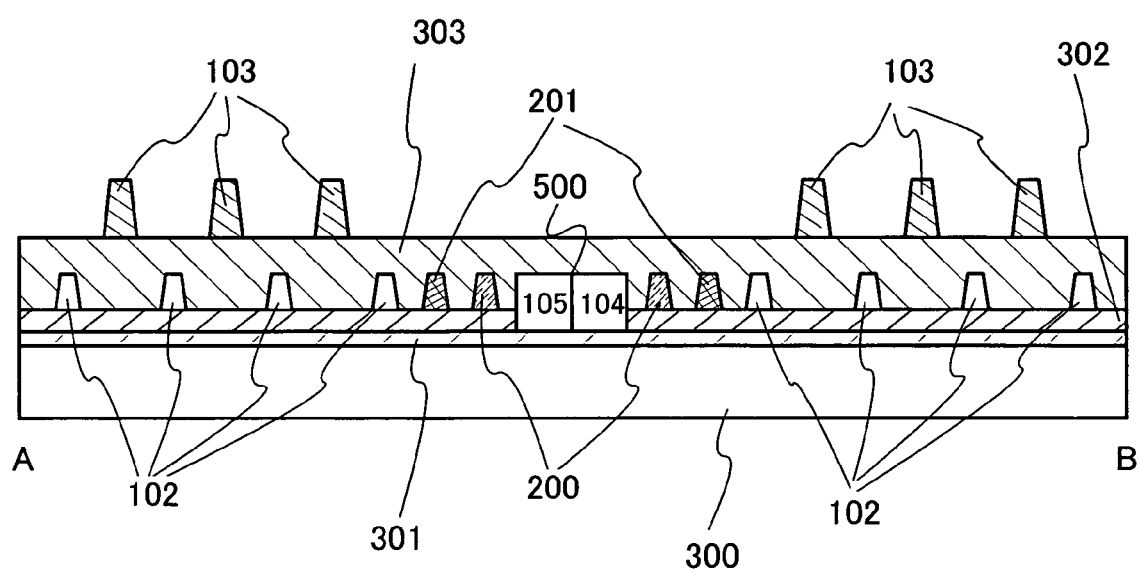
FIG. 3 is a cross-sectional view of a semiconductor device of the present invention.

FIG. 3 shows a cross-sectional view taken along line A-B in FIG. 2 that is the top view of the semiconductor device that can transmit and receive data by wireless communication. As shown in FIG. 3, the semiconductor device of the present invention that can transmit and receive data by wireless communication includes a substrate 300, a first insulating film 302, the tag 500 including the digital portion 105 and the analog portion 104, the VDD wiring 200, the GND wiring 201, the first antenna 102, a second insulating film 303, and the second antenna 103. A base film 301 or another component may be provided if necessary. The tag 500 including the analog portion 104 and the digital portion 105 is formed with many thin film elements typified by thin film transistors. In the cross-sectional view, the analog portion 104 and the digital portion 105 are located between one part and another part of the VDD wiring 200, the GND wiring 201, and the first antenna 102. The first insulating film 302 is a layer provided to electrically insulate the wiring forming layer from a semiconductor layer forming layer of a thin film transistor. The second insulating film 303 is a layer separating the first antenna 102 from the second antenna 103. In other words, the first antenna and the second antenna are provided in different layers separated by the second insulating film 303.

Meanwhile, unintended parasitic capacitance is generated between wirings of the first antenna 102 and the second antenna 103 in the case where the wiring of the first antenna and the wiring of the second antenna 103 are arranged to overlap each other with the second insulating film 303 interposed therebetween, when seen from a direction perpendicular to the substrate 300 as shown in FIG. 2. This parasitic capacitance interferes with resonance of the semiconductor device that can transmit and receive data by wireless communication. In order to avoid this influence, the wiring of the first antenna 102 and the wiring of the second antenna 103 are preferably arranged so as not to overlap each other except in portions where the two antennas intersect and are electrically connected, when seen from a direction perpendicular to the substrate 300. In other words, the first antenna and the second antenna are preferably arranged so as not to overlap each other except in an intersecting portion and an electrically connecting portion when seen from a direction perpendicular to the substrate. Note that FIG. 2 shows an example of a portion 210 where the first antenna 102 and the second antenna 103 intersect and a portion 220 where the antennas are electrically connected, when seen from a direction perpendicular to the substrate 300. The distance between the wiring of the first antenna 102 and the wiring of the second antenna 103 is not particularly specified here, and can be appropriately set by the user.

Figure 8:
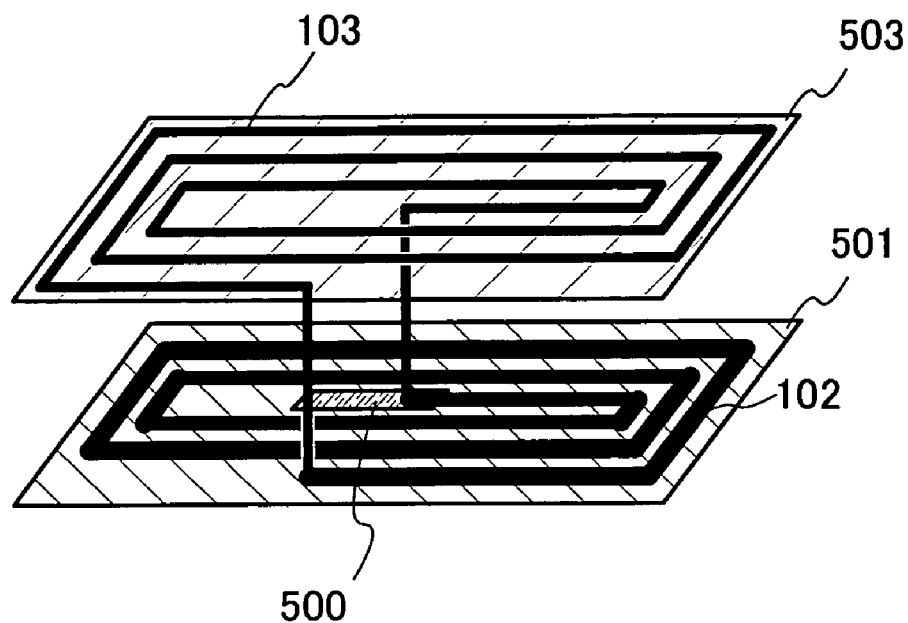
FIG. 8 is a diagram showing one embodiment mode of a semiconductor device of the present invention.

Since the wiring of the first antenna 102 in the present invention is formed of a wiring material of the thin film transistor in the wiring forming layer of the thin film transistor, it is thinner than the wiring of the second antenna 103. Therefore, there is the case where impedance (resistance) becomes high. This leads to loss in extracting power. The wiring of the first antenna 102 may be formed to be wide as shown in FIG. 8 to decrease the impedance (resistance) and improve efficiency of electromagnetic coupling.

Figure 9:
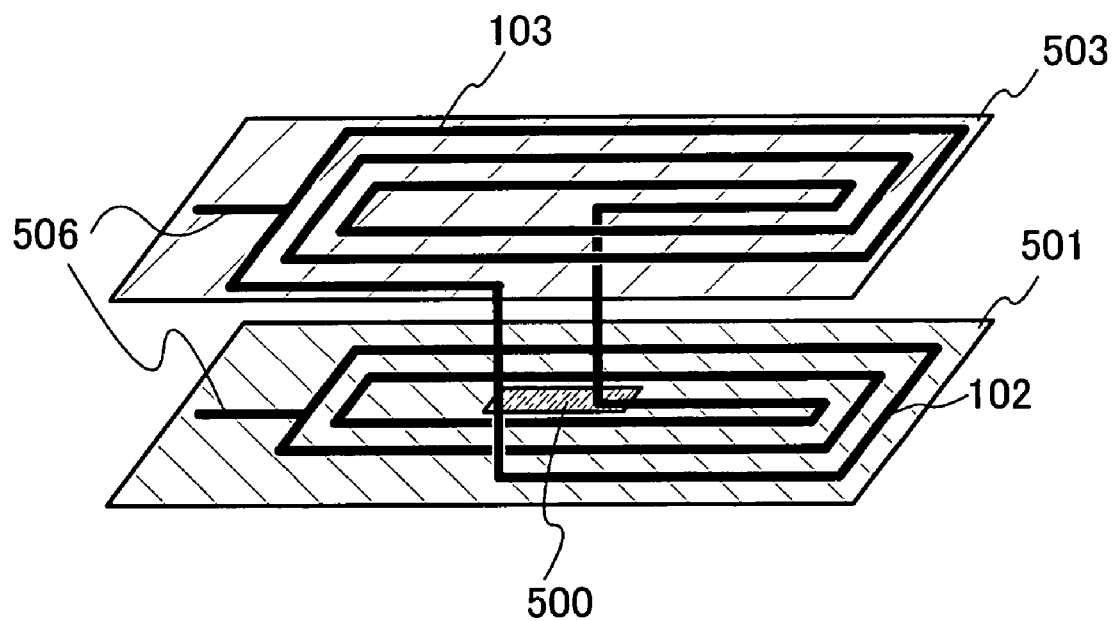
FIG. 9 is a diagram showing one embodiment mode of a semiconductor device of the present invention.

As another structure of the antenna, the antenna may be provided with a resonance capacitor portion 506 as shown in FIG. 9. The resonance capacitor portion 506 can reduce resonance capacitance which is originally in the tag 500 and reduce the size of the RFID tag.

Figure 4:
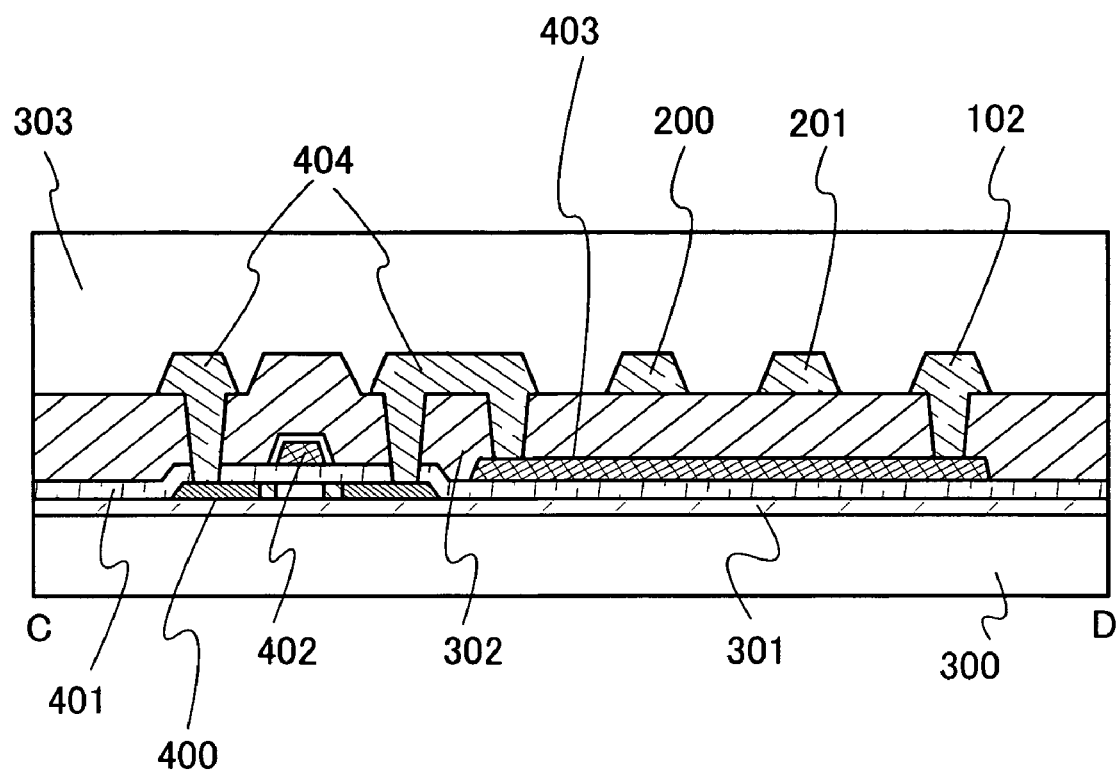
FIG. 4 is a cross-sectional view of a connection portion of an analog portion and a first antenna in a semiconductor device of the present invention.
Figure 5:
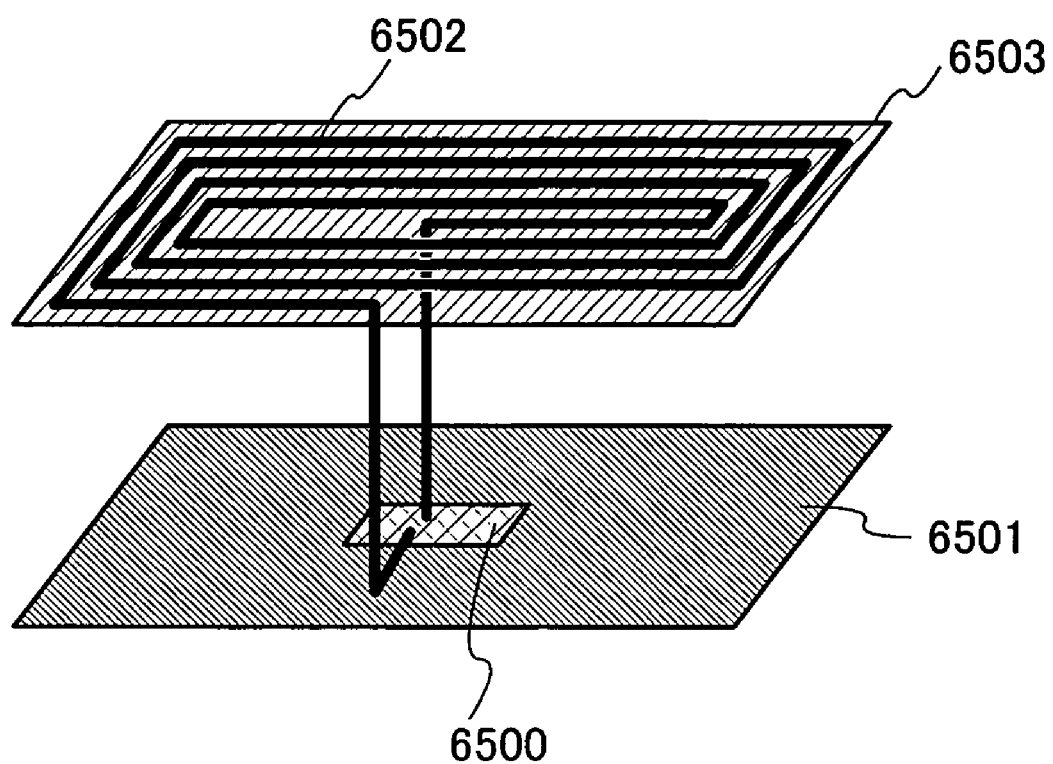
FIG. 5 is a diagram showing a structure of a conventional semiconductor device that can transmit and receive data by wireless communication.

FIG. 4 shows a cross-sectional view taken along line C-D of FIG. 2 that is the top view of the semiconductor device of the present invention that can transmit and receive data by wireless communication, in other words, a cross-sectional view of a connection portion of the analog portion 104 and the first antenna 102. Here, only one thin film transistor among a large number of thin film elements in the analog portion 104 is shown and explained.

As shown in FIG. 4, a semiconductor layer 400 serving as an active layer of the thin film transistor is provided over the base film 301. The semiconductor layer 400 is covered with a gate insulating film 401 and electrically insulated from a gate electrode 402. In the analog portion 104 included in the tag 500 explained in FIG. 1, a thin film transistor including the semiconductor layer 400, the gate insulating film 401, and the gate electrode 402 is provided as shown in FIG. 4. A source or drain wiring 404 which is formed over the first insulating film 302 is electrically connected to the semiconductor layer 400 of the thin film transistor through a contact hole formed in the first insulating film 302. The VDD wiring 200, the GND wiring 201, and the first antenna 102, which are formed of the same material and in the same layer as the source or drain wiring 404 at the same time, are also provided over the first insulating film 302. At this time, the VDD wiring 200 and the GND wiring 201 are located between the source or drain wiring 404 and the first antenna 102.

In addition, the analog portion 104 included in the tag 500 explained in FIG. 1 is electrically connected to one end of the first antenna 102 as shown in FIG. 2. At this time, a wiring 403 connecting the thin film transistor provided in the analog portion 104 to the first antenna 102 is preferably formed of the same material and in the same layer as the gate electrode 402 at the same time, as shown in FIG. 4, in order to reduce the number of steps. Note that the thin film transistor provided in the analog portion 104 is electrically connected to the wiring 403 through the source or drain wiring 404. In other words, the source or drain wiring 404 is connected to the first antenna 102 through the wiring 403 formed of the same material as the gate electrode 402. In addition, the VDD wiring 200 and the GND wiring 201 are formed over the wiring 403 with the first insulating film 302 interposed therebetween.

Although not shown in FIG. 4, the second antenna is formed over the second insulating film 303. This second antenna is formed in a different layer from the first antenna 102, which is separated from the first antenna 102 by the second insulating film 303. In other words, the second antenna is formed in a different layer from the first antenna formed of the same material and in the same layer as the source or drain wiring 404 at the same time.

The semiconductor device of the invention that can transmit and receive data by wireless communication, which has the structure as described above, can be miniaturized without changing the number of steps and communication distance. In addition, the semiconductor device of the invention can increase communication distance without changing its size. Further, the semiconductor device of the invention can be miniaturized or can increase communication distance without changing its size, and can suppress decreases in yield and throughput as well. Moreover, the semiconductor device of the present invention can be miniaturized or can increase communication distance without changing its size, and can suppress an increase in manufacturing cost as well.

Embodiment Mode 2

Figure 10A:
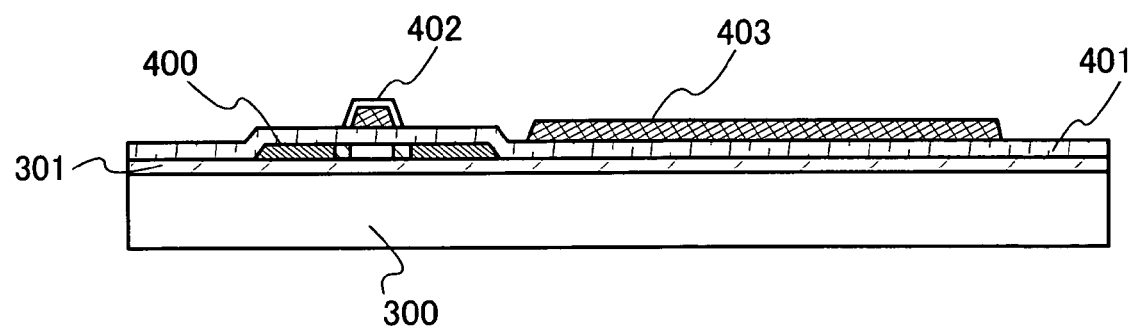
FIGS. 10A to 10C are diagrams showing a method for manufacturing a semiconductor device of the present invention.
Figure 10B:
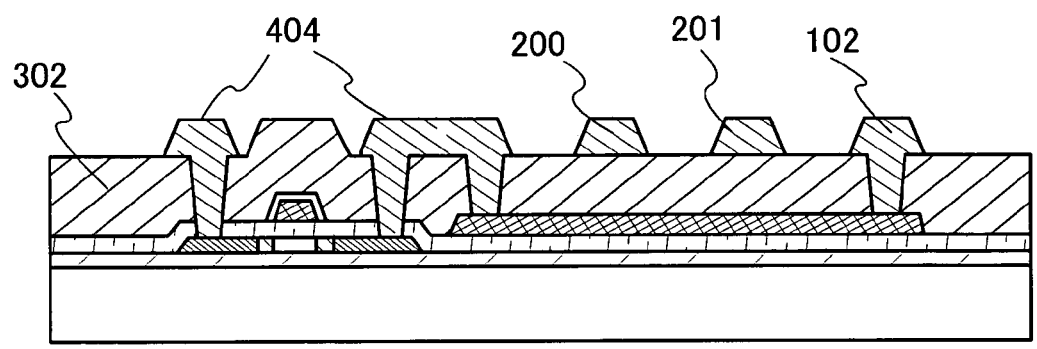
Figure 10C:
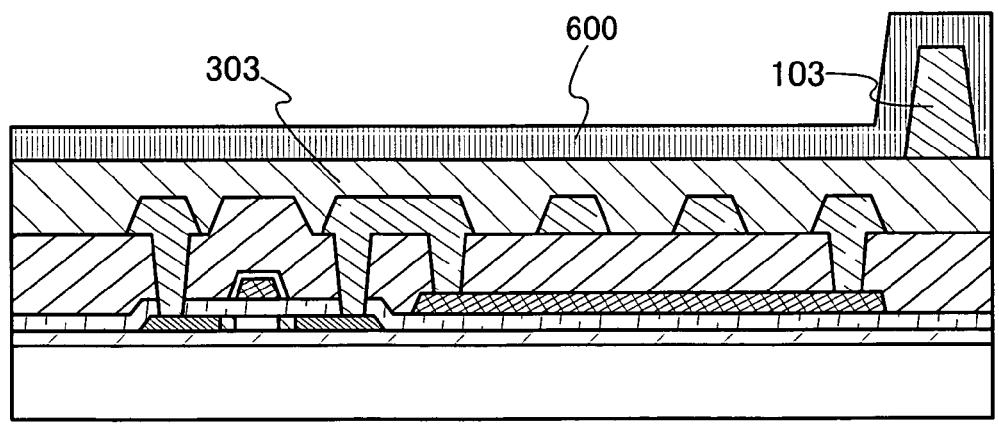

A method for manufacturing the semiconductor device of the present invention that can transmit and receive data by wireless communication is explained in this embodiment mode with reference to FIGS. 10A to 10C. In this embodiment mode, a thin film element in a tag is explained, while showing only a single thin film transistor in an analog portion. Note that another thin film element can also be manufactured in a similar manner, and it is easy for a person skilled in the art to apply this manufacturing method to another thin film element based on common general technical knowledge.

As the substrate 300, a glass substrate of barium borosilicate glass, alumino borosilicate glass, or the like, a quartz substrate, a ceramic substrate, or the like can be used. In addition, a semiconductor substrate on a surface of which an insulating film is formed may be used. A flexible substrate such as a plastic substrate may be used. Further, the surface of the substrate may be polished by a CMP method or the like so as to be planarized, and a glass substrate, a quartz substrate, or a semiconductor substrate which is thinned by polishing may be used.

The base film 301 is formed over the substrate 300. The base film 301 can be formed with an insulating film of silicon oxide, silicon nitride, silicon nitride oxide, or the like. By forming the base film 301, impurities in the substrate 300 which adversely affect the semiconductor layer 400 can be prevented from diffusing. In FIG. 10A, the base film 301 is formed with a single layer, but it may be formed with two or more layers. Note that the base film 301 is not necessarily formed in the case where impurities in the substrate 300 do not cause a problem.

The base film 301 may be formed by treating the surface of the substrate 300 with high-density plasma. The high-density plasma is generated by using, for example, a microwave of 2.45 GHz, and is assumed to have an electron density of $10^{11}/cm^3$ to $10^{13}/cm^3$, an electron temperature of 2 eV or less, and an ion energy of 5 eV or less. Active species of such high-density plasma has low kinetic energy, and damage due to plasma is less than the case of conventional plasma treatment; thus, a film with few defects can be formed. The distance from an antenna generating a microwave to the substrate 300 is preferably set to be 20 mm to 80 mm, more preferably, 20 mm to 60 mm.

In addition, the surface of the substrate 300 can be nitrided by performing the above-described high-density plasma treatment in a nitriding atmosphere, for example, in an atmosphere including nitrogen and a noble gas, an atmosphere including nitrogen, hydrogen, and a noble gas, or an atmosphere including ammonia and a noble gas. In the case of using a glass substrate, a quartz substrate, a silicon wafer, or the like as the substrate 300 and performing nitriding treatment with the above-described high-density plasma, a nitride film formed on the surface of the substrate 300 contains silicon nitride as its main component; thus, the nitride film can be used as the base film 301. A film of silicon oxide or silicon oxynitride may be formed over the nitride layer by a plasma CVD method, which may be used as the base film 301 including a plurality of layers.

In addition, a nitride film can be formed on the surface of the base film 301 formed of silicon oxide, silicon oxynitride, or the like by performing nitriding treatment with similar high-density plasma on the surface of the base film 301. This nitride film can suppress diffusion of impurities from the substrate 300. In addition, the nitride film can be formed very thin. Therefore, the nitride film is preferable since it has little influence of stress on the semiconductor layer to be formed thereover.

Subsequently, the semiconductor layer 400 is formed over the base film 301. The semiconductor layer 400 can be formed using a patterned crystalline semiconductor film, amorphous semiconductor film, or organic semiconductor. A mask formed by exposing to light and developing a photosensitive resist using a photomask is used for the patterning. At this time, transmission of light used for light exposure can be suppressed in an arbitrary portion of the photomask to control the thickness of the mask after development. The patterning can be performed more finely and precisely by controlling the thickness of the mask.

An example of forming the semiconductor layer 400 with a crystalline semiconductor film is explained in this embodiment mode. The crystalline semiconductor film can be obtained by crystallizing an amorphous semiconductor film. As a crystallizing method, laser crystallization, thermal crystallization using RTA or an annealing furnace, thermal crystallization using a metal element that promotes crystallization, or the like can be used. The semiconductor layer 400 includes a channel formation region and an impurity region to which an impurity element imparting a conductivity type is added. Note that the impurity element imparting a conductivity type may be added to a portion corresponding to a channel region, which makes it possible to control a threshold voltage of the semiconductor layer.

Subsequently, the gate insulating film 401 is formed. The gate insulating film 401 may be formed with a single layer or a plurality of layers using silicon oxide, silicon nitride, silicon nitride oxide, or the like. In this case, the surface of the gate insulating film 401 may be treated with high-density plasma in an oxidizing atmosphere or a nitriding atmosphere to be oxidized or nitrided for densification.

Note that, before forming the gate insulating film 401, the surface of the semiconductor layer 400 may be subjected to high-density plasma treatment to be oxidized or nitrided. By performing the treatment in an oxidizing atmosphere or a nitriding atmosphere with the substrate 300 at a temperature of 300° C. to 450° C. at this time, the semiconductor layer 400 can form a favorable interface with the gate insulating film 401 to be formed thereover.

As the gate electrode 402, a single layer or a plurality of layers formed of one of tantalum, tungsten, titanium, molybdenum, aluminum, copper, chromium, and niobium or an alloy or compound containing one or a plurality of them can be patterned and used. At the same time, the wiring 403 for electrically connecting an analog portion and the first antenna 102 is formed. The wiring 403 is formed of the same material at the same time as the gate electrode 402, thereby reducing the number of steps and improving yield and throughput. Here, the gate electrode 402 and a wiring such as the wiring 403 formed at the same time as the gate electrode 402 are preferably led so as to have a round corner when seen from a direction perpendicular to the substrate 300. The round corner can prevent dust or the like from remaining in the corner of the wiring, which can suppress defects caused by dust and improve yield. A mask formed by exposing to light and developing a photosensitive resist using a photomask is used for the patterning. At this time, transmission of light used for light exposure can be suppressed in an arbitrary portion of the photomask to control the thickness of the mask after development. The patterning can be performed more finely and precisely by controlling the thickness of the mask.

The thin film transistor includes the semiconductor layer 400, the gate insulating film 401, and the gate electrode 402. In this embodiment mode, the thin film transistor is explained as a top-gate transistor; however, it may be a bottom-gate transistor or a dual-gate transistor having gate electrodes above and below a semiconductor layer.

Subsequently, the first insulating film 302 is formed (FIG. 10B). As the first insulating film 302, an inorganic insulating film or an organic insulating film having a single-layer or laminated-layer structure can be used. As the inorganic insulating film, a silicon oxide film formed by a CVD method, a silicon oxide film applied by an SOG (Spin on Glass) method, or the like can be used. As the organic insulating film, a film of polyimide, polyamide, BCB (benzocyclobutene), acrylic, a positive type photosensitive organic resin, a negative type photosensitive organic resin, or the like can be used.

In addition, a material having a skeleton structure including a bond of silicon and oxygen can also be used for the first insulating film 302. As a substituent of this material, a substituent containing at least hydrogen (for example, an alkyl group or an aryl group) is used. A fluoro group may be used as the substituent. Alternatively, the material may include both of the substituents.

In the case of forming the first insulating film 302 with a plurality of layers, a layer closer to the semiconductor layer 400 is preferably formed with an insulating film having a barrier property which blocks ionic impurities, such as a film containing silicon nitride as its main component. This film can be used as a protective film for preventing contamination of the semiconductor layer 400. After forming this layer, hydrogenation may be performed by introducing a hydrogen gas and performing high-density plasma treatment. This makes it possible to density the layer. Thereafter, hydrogen can be released by performing heat treatment at 400° C. to 450° C. to hydrogenate the semiconductor layer 400.

The wiring 404 of the thin film transistor is formed by patterning a single layer or a plurality of layers using one of aluminum, nickel, tungsten, molybdenum, titanium, platinum, copper, tantalum, gold, and manganese or an alloy or a compound containing one or a plurality of them. An example of a single-layer structure is shown in the drawing. Note that the wiring 404 is preferably formed to have a round corner when seen from a direction perpendicular to the substrate 300. The round corner can prevent dust or the like from remaining in the corner. In addition, the VDD wiring 200, the GND wiring 201, and the first antenna 102 are simultaneously formed using the same material as the wiring 404. A mask formed by exposing to light and developing a photosensitive resist using a photomask is used for the patterning. At this time, transmission of light used for light exposure can be suppressed in an arbitrary portion of the photomask to control the thickness of the mask after development. The patterning can be performed more finely and precisely by controlling the thickness of the mask.

Subsequently, the second insulating film 303 is formed (FIG. 10C). As the second insulating film 303, an inorganic insulating film or an organic insulating film having a single-layer or laminated-layer structure can be used. A specific material is similar to that of the first insulating film 302.

Thereafter, the second antenna 103 is formed over the second insulating film 303. The second antenna 103 is formed so as not to overlap the first antenna 102. The second antenna 103 is formed with a single layer or a plurality of layers using one of aluminum, nickel, tungsten, molybdenum, titanium, platinum, copper, tantalum, gold, and manganese or an alloy or a compound containing one or a plurality of them. An example of a single-layer structure is shown in the drawing. In addition, the second antenna 103 can be formed by a droplet discharge method using conductive paste containing nano particles of Au, Ag, Cu, or the like. The droplet discharge method is a generic term for methods for forming a pattern by discharging a droplet, such as an ink-jet method or a dispenser method, and has an advantage of improvement in material use efficiency or the like.

Subsequently, a third insulating film 600 is formed over the second insulating film 303 and the second antenna 103. The third insulating film 600 may be formed with an inorganic insulating film or an organic insulating film having a single-layer or laminated-layer structure. The third insulating film 600 functions as a protective layer of the second antenna 103.

Thereafter, sealing is performed and a semiconductor device of the present invention is completed. Note that the semiconductor device formed over the substrate 300 may be used as is, but the manufactured element may be peeled off from the substrate 300 and may be attached to a flexible substrate.

There is a method for peeling by providing a peeling layer over the substrate 300 in advance and removing the peeling layer with an etchant. In addition, there is a method by which the peeling layer is partially removed with an etchant and then the substrate 300 is physically removed, a method by which the substrate 300 is mechanically removed, a method by which the substrate 300 is removed by etching with a solution or gas, or the like.

In addition, the peeled element may be attached to a flexible substrate using a commercial adhesive, an example of which is an epoxy resin based adhesive.

By being formed over a flexible substrate as described above, the semiconductor device of the present invention can be made thin, lightweight, and hard to be damaged even when dropped. In addition, the semiconductor device can reasonably be attached to an object having a curved surface by using a flexible substrate.

Embodiment 1

In this embodiment, applications of the semiconductor device of the present invention are explained with reference to FIGS. 11A and 11B, FIGS. 12A to 12E and FIGS. 18A and 18B. A semiconductor device 700 of the present invention can be mounted on, for example, paper money, coins, securities, bearer bonds, a certificate (such as a driver's license or a resident's card (see FIG. 12A)), a packing case (such as a wrapper or a bottle (see FIG. 12B)), a recoding medium such as DVD software, a CD, or a video tape (see FIG. 12C), a vehicle such as a car, a motorcycle, or a bicycle (see FIG. 12D), personal belongings such as a bag or glasses (see FIG. 12E), food, clothing, commodities, an electronic device, or the like. The electronic device includes a liquid crystal display device, an EL display device, a television device (also simply referred to as TV or a television receiver), a cellular phone, and the like.

The semiconductor device of the invention can be fixed to an article by being attached to the surface of the article, embedded in the article, or the like. For example, the semiconductor device may be embedded in paper of a book, or in an organic resin of a package formed of the organic resin. By mounting the semiconductor device of the present invention on paper money, coins, securities, bearer bonds, a certificate, or the like, forgery can be prevented. Further, by mounting the semiconductor device of the present invention on a packing case, a recoding medium, personal belongings, food, clothing, commodities, an electronic device, or the like, efficiency of an inspection system, a system for a rental shop, or the like can be improved. By mounting the semiconductor device of the present invention on a vehicle, forgery or robbery can be prevented. Further, by implanting the semiconductor device of the present invention in a creature such as an animal, an individual creature can be easily identified. For example, by implanting a wireless tag in a creature such as livestock, its birth year, sex, breed, or the like can be easily identified.

As described above, any article (including a creature) can be provided with the semiconductor device of the present invention.

Since the semiconductor device of the present invention is advantageous for miniaturization, has high yield and throughput, and can be manufactured at low cost, it is attached at ease and is extremely effective for these applications for which a large number of semiconductor devices are used.

Figure 11A:
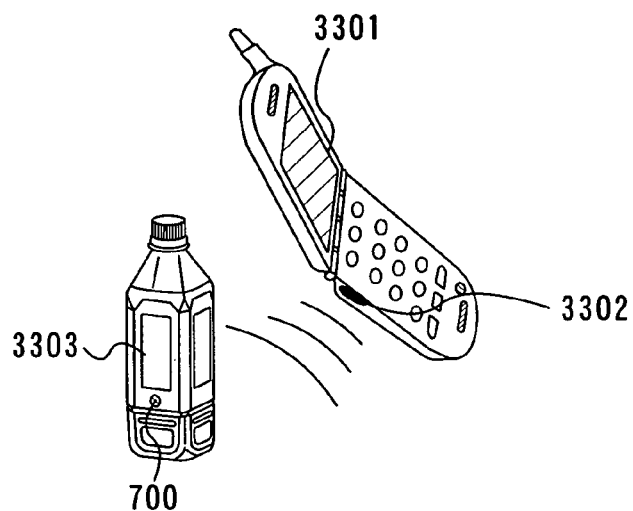
FIGS. 11A and 11B are diagrams each showing a system using a semiconductor device of the present invention.
Figure 11B:
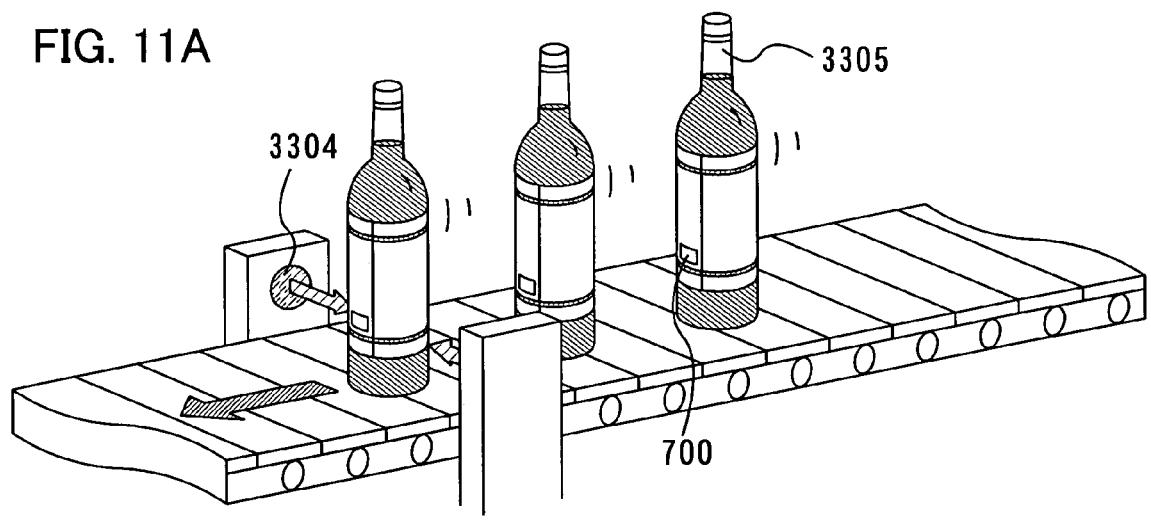
Figure 12A:
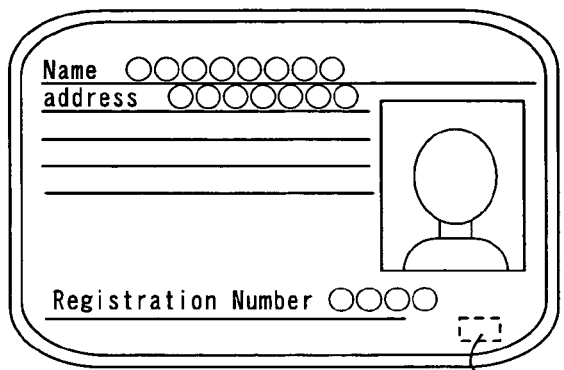
FIGS. 12A to 12E are diagrams each showing an application of a semiconductor device of the present invention.
Figure 12B:
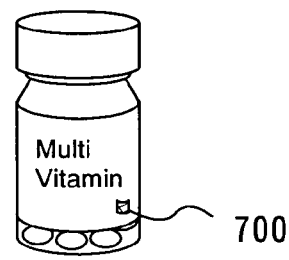
Figure 12C:
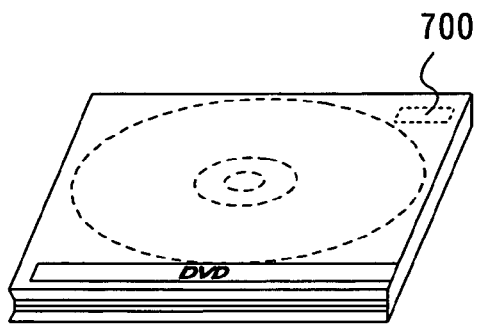
Figure 12D:
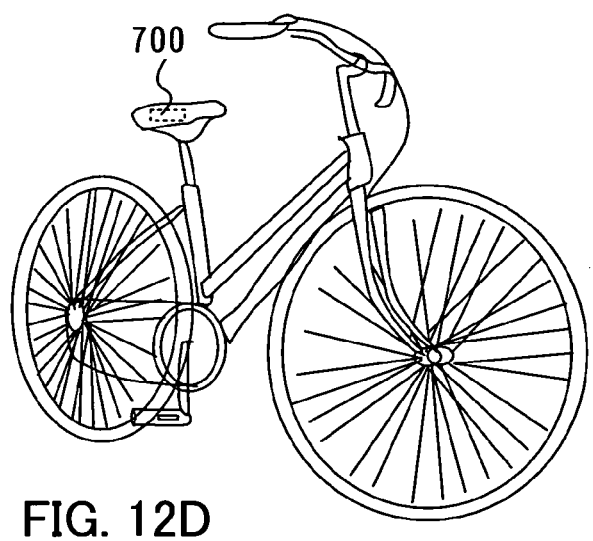
Figure 12E:
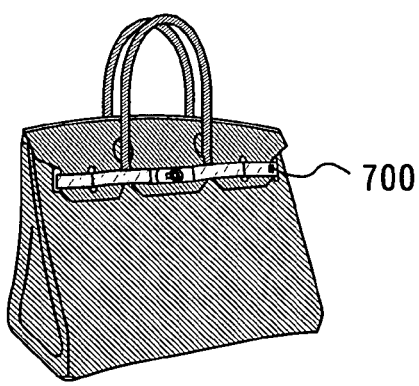

Subsequently, modes of a system using the semiconductor device of the present invention are explained with reference to FIGS. 11A and 11B. A side face of a portable terminal including a display portion 3301 is provided with a reader/writer 3302. In addition, a side face of an article 3303 is provided with the semiconductor device 700 of the present invention (see FIG. 11A). When the reader/writer 3302 is held over the semiconductor device 700 of the present invention included in the article 3303, information on the article 3303 such as a raw material, the place of origin, an inspection result in each production process, the history of distribution, or an explanation of the article is displayed on the display portion 3301. Further, as another system, an article 3305 can be inspected using a reader/writer 3304 and the semiconductor device 700 when the article 3305 is transported by a conveyor belt (see FIG. 11B). Thus, by utilizing the semiconductor device of the present invention for a system, information can be acquired easily, and improvement in functionality and added value of the system can be achieved.

Figure 18A:
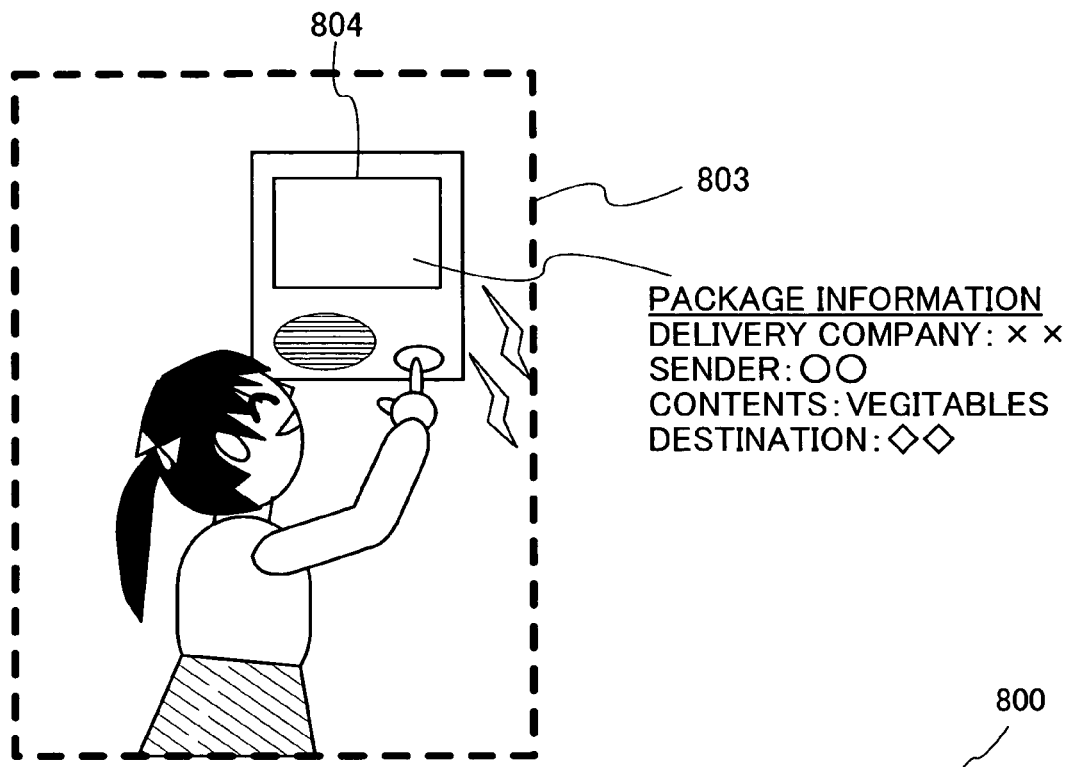
FIGS. 18A and 18B are diagrams showing a system using a semiconductor device of the present invention.
Figure 18B:
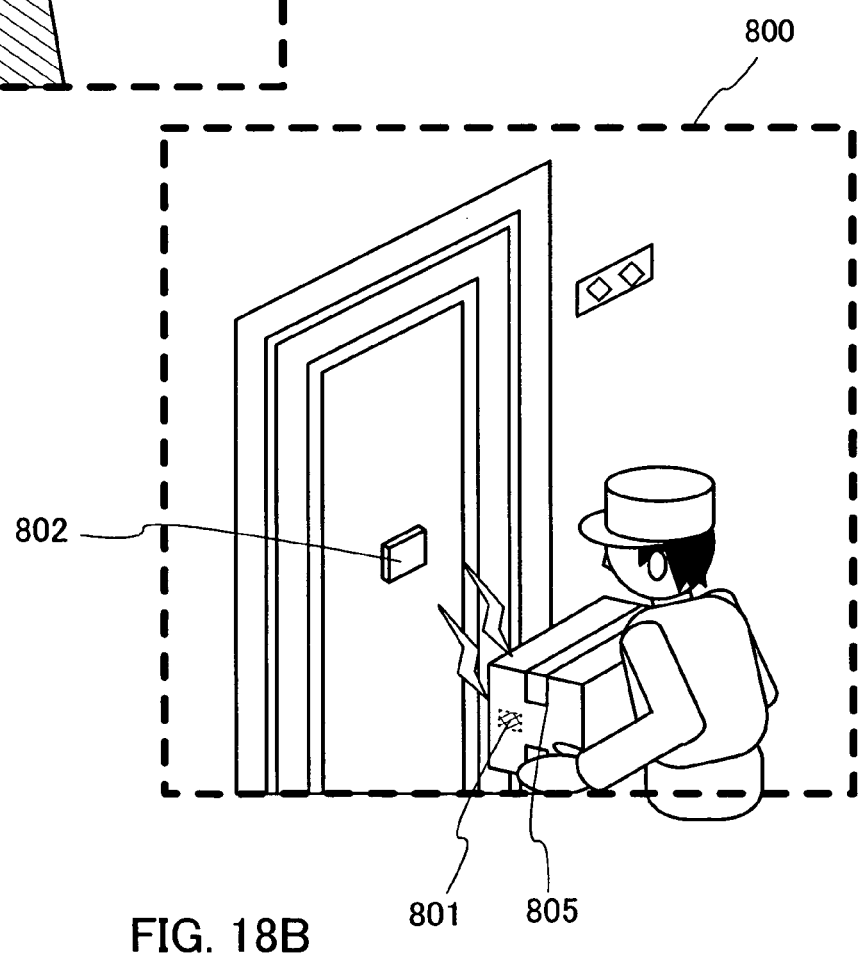

FIGS. 18A and 18B are diagrams showing another system using the semiconductor device of the present invention. This system is applied when sending a package by using a delivery service. As shown in FIG. 18B, a sender previously attaches a semiconductor device 801 of the present invention to an article 805 to be sent. At least sender information is pre-stored in the semiconductor device 801. Information to be stored may also be another kind of information such as destination, delivery company, or content. The amount of money to be paid may be displayed in the case of mail order. When a deliveryman comes to deliver a package, a reader/writer 802 installed at an entrance 800 reads package information, and the information is displayed on a display portion 804 which may also function as a part of an intercom inside a house 803 as shown in FIG. 18A. A family member can respond after checking the information, and misdelivery, or solicitation or a crime by pretending to be a deliveryman can be prevented.

Thus, the system is effective as a safety measure particularly for families with children. Since the semiconductor device of the present invention has a longer communication distance (higher sensitivity) than a conventional semiconductor device having the same size, package information can be certainly received even when the semiconductor device of the present invention is located inside the package. In addition, this system may be applied to small mail such as a letter typified by registered mail or delivery-certified mail as well as a large package. In this case, the semiconductor device of the present invention which is easily miniaturized can be favorably used.

Embodiment 2

Figure 13:
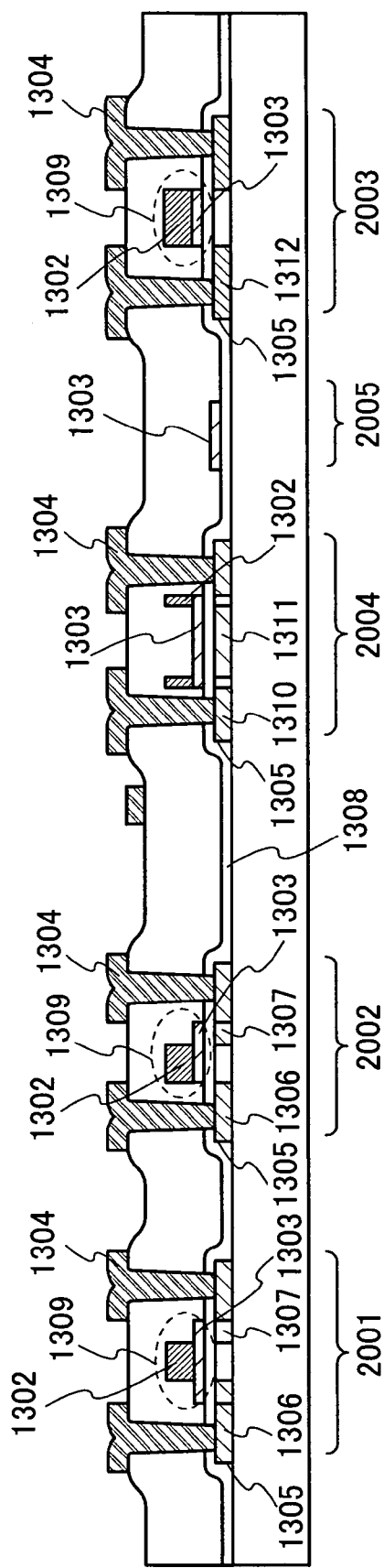
FIG. 13 is a partial cross-sectional view of a semiconductor device of the present invention.

FIG. 13 shows a cross-sectional structure of a transistor which constitutes a part of a circuit included in the semiconductor device of the present invention. FIG. 13 shows an n-channel transistor 2001, an n-channel transistor 2002, a capacitor element 2004, a resistor element 2005, and a p-channel transistor 2003. Each transistor includes a semiconductor layer 1305, a gate insulating layer 1308, and a gate electrode 1309. The gate electrode 1309 is formed to have a laminated structure of a first conductive layer 1303 and a second conductive layer 1302. FIG. 14A to 14D are top views corresponding to the transistor, the capacitor element, and the resistor element shown in FIG. 13 and can also be referred to.

In the n-channel transistor 2001 in FIG. 13, an impurity region 1306 which forms source and drain regions to be connected to a wiring 1304, and an impurity region 1307 doped to have lower impurity concentration than that of the impurity region 1306, are formed in the semiconductor layer 1305 in a channel length direction (direction in which carriers flow). The impurity region 1307 is also referred to as a lightly doped drain (LDD). When the n-channel transistor 2001 is formed, phosphorus or the like is added to the impurity region 1306 and the impurity region 1307 as an impurity which imparts n-type conductivity. The LDD is formed as a means for suppressing hot electron deterioration or a short-channel effect.

Figure 14A:
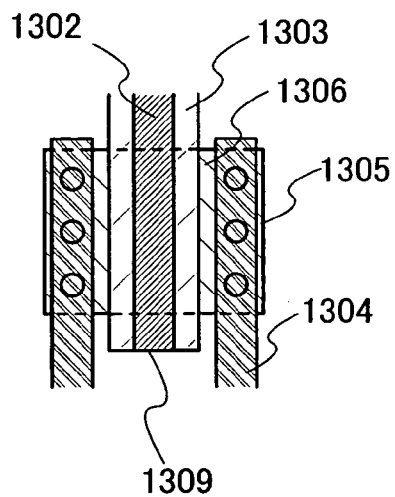
FIGS. 14A to 14E are partial top views of a semiconductor device of the present invention.

As shown in FIG. 14A, in the gate electrode 1309 of the n-channel transistor 2001, the first conductive layer 1303 is formed to be spread to both sides of the second conductive layer 1302. In this case, the first conductive layer 1303 is formed to be thinner than the second conductive layer. The first conductive layer 1303 is formed to have such a thickness as to allow ion species accelerated with an electric field of 10 kV to 100 kV to pass. The impurity region 1307 is formed so as to overlap with the first conductive layer 1303 of the gate electrode 1309. In other words, an LDD region which overlaps with the gate electrode 1309 is formed. In this structure, in the gate electrode 1309, the impurity region 1307 is formed in a self-aligned manner by adding an impurity having one conductivity type through the first conductive layer 1303 using the second conductive layer 1302 as a mask. In other words, the LDD which overlaps with the gate electrode is formed in a self-aligned manner.

A transistor having the LDD on both sides of a channel forming region can be applied to a transistor for rectification of a power supply circuit or a transistor which forms a transmission gate (also referred to as an analog switch) used for a logic circuit. In these transistors, both positive and negative voltages are applied to source and drain electrodes; therefore, the LDD is preferably provided on both sides of the channel forming region.

Figure 14B:
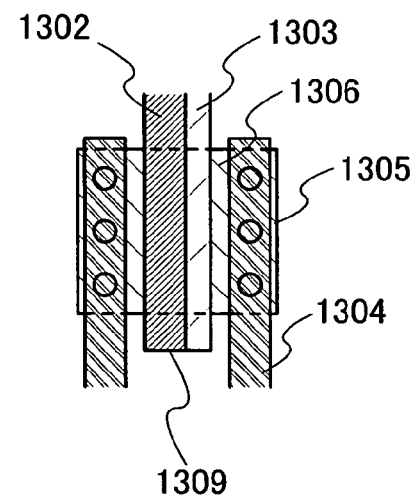

In FIG. 13, in the n-channel transistor 2002, an impurity region 1306 which forms source and drain regions, and an impurity region 1307 doped to have lower impurity concentration than that of the impurity region 1306, are formed in the semiconductor layer 1305. The impurity region 1307 is provided on one side of the channel forming region so as to be in contact with the impurity region 1306. As shown in FIG. 14B, in the gate electrode 1309 of the n-channel transistor 2002, the first conductive layer 1303 is formed to be spread to one side of the second conductive layer 1302. Also in this case, the LDD can be formed in a self-aligned manner by adding an impurity having one conductivity type through the first conductive layer 1303 using the second conductive layer 1302 as a mask.

The transistor having the LDD on one side of the channel forming region may be applied to a transistor to which only a positive voltage or a negative voltage is applied between the source and drain electrodes. Specifically, the transistor may be applied to a transistor which forms a logic gate such as an inverter circuit, a NAND circuit, a NOR circuit, or a latch circuit, or a transistor which forms an analog circuit such as a sense amplifier, a constant voltage generation circuit, or a VCO.

Figure 14C:
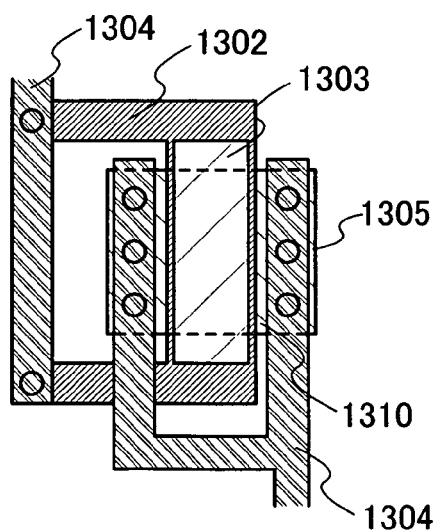
Figure 14D:
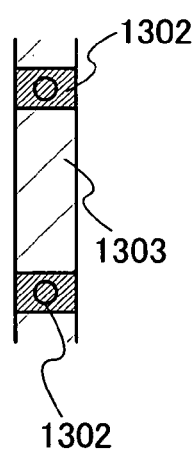
Figure 14E:
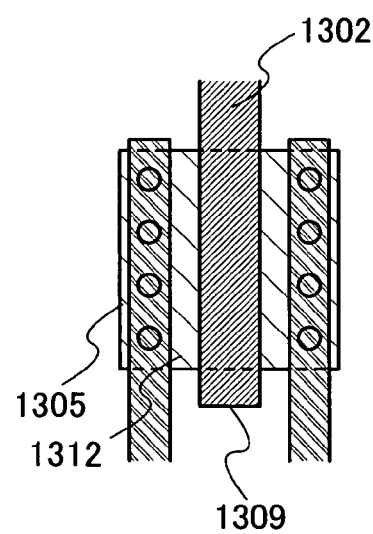

In FIG. 13, the capacitor element 2004 is formed so that the gate insulating layer 1308 is interposed between the first conductive layer 1303 and the semiconductor layer 1305. The semiconductor layer 1305 which forms the capacitor element 2004 is provided with an impurity region 1310 and an impurity region 1311. The impurity region 1311 is formed in a position overlapping with the first conductive layer 1303 in the semiconductor layer 1305. Further, the impurity region 1310 is connected to the wiring 1304. An impurity having one conductivity type can be added to the impurity region 1311 through the first conductive layer 1303; therefore, impurity concentrations of the impurity region 1310 and the impurity region 1311 can be made equal or different from each other. In either case, the semiconductor layer 1305 is made to serve as an electrode in the capacitor element 2004; therefore, an impurity having one conductivity type is preferably added to reduce resistance. In addition, the first conductive layer 1303 can be made to serve as an electrode sufficiently by utilizing the second conductive layer 1302 as an auxiliary electrode as shown in FIG. 14C. Thus, by employing a compositive electrode structure in which the first conductive layer 1303 and the second conductive layer 1302 are combined, the capacitor element 2004 can be formed in a self-aligned manner.

The capacitor element is used as a storage capacitor included in a power supply circuit or a resonant capacitor included in a resonant circuit. In particular, since both positive and negative voltages are applied between two terminals of the capacitor element, the resonant capacitor needs to serve as a capacitor regardless of whether a voltage applied between the two terminals is positive or negative.

In FIG. 13, the resistor element 2005 is made of the first conductive layer 1303. The first conductive layer 1303 is formed to have a thickness of approximately 30 nm to 150 nm; therefore, the resistor element can be formed by appropriately setting a width or length thereof.

The resistor element is used as a resistance load included in a modulation circuit. In addition, there is a case where the resistor element is used as a load in controlling a current by a VCO or the like. The resistor element may be formed with a semiconductor layer including an impurity element at high concentration or a thin metal layer. The metal layer is preferable since a resistance value thereof is determined by a thickness and film quality, and thus variation is small, while a resistance value of the semiconductor layer depends on a thickness, film quality, impurity concentration, an activation ratio, and the like.

In FIG. 13, the p-channel transistor 2003 is provided with an impurity region 1312 in the semiconductor layer 1305. This impurity region 1312 forms source and drain regions connected to the wiring 1304. The gate electrode 1309 has a structure in which the first conductive layer 1303 and the second conductive layer 1302 overlap. The p-channel transistor 2003 is a transistor having a single-drain structure without providing an LDD. In the case of forming the p-channel transistor 2003, boron or the like is added to the impurity region 1312 as an impurity which imparts p-type conductivity. On the other hand, if phosphorus is added to the impurity region 1312, an n-channel transistor having a single-drain structure can be formed.

Excitation with a microwave may be conducted and oxidizing or nitriding treatment may be conducted using high-density plasma treatment with an electron temperature of 2 eV or less, an ion energy of 5 eV or less, and an electron density of approximately $10^{11}/cm^3$ to $10^{13}/cm^3$, with respect to one or both of the semiconductor layer 1305 and the gate insulating layer 1308. At this time, treatment is conducted with a substrate temperature of 300° C. to 450° C. and in an oxidizing atmosphere ($O_2$, $N_2O$, or the like) or a nitriding atmosphere ($N_2$, $NH_3$, or the like), thereby reducing a defective state of an interface between the semiconductor layer 1305 and the gate insulating layer 1308. By performing this treatment on the gate insulating layer 1308, this insulating layer can be densified. In other words, generation of a charged defect and variation in threshold voltage of a transistor can be suppressed. In the case where a transistor is driven at a voltage of 3 V or less, the insulating layer which is oxidized or nitrided by this plasma treatment can be used as the gate insulating layer 1308. In the case where a transistor is driven at a voltage of 3 V or more, the gate insulating layer 1308 can be formed by combing the insulating layer which is formed on a surface of the semiconductor layer 1305 by this plasma treatment and the insulating layer which is deposited by a CVD method (a plasma CVD method or a thermal CVD method). In the same manner, this insulating layer can be utilized as a dielectric layer of the capacitor element 2004. In this case, the insulating layer formed by this plasma treatment is formed to have a thickness of 1 nm to 10 nm and to be dense; therefore, a capacitor element having large charge capacity can be formed.

As explained with reference to FIG. 13 and FIGS. 14A to 14E, elements having various structures can be formed by combing conductive layers each having a different thickness. A region where only the first conductive layer is formed and a region where the first conductive layer and the second conductive layer are stacked can be formed using a photomask or a reticle, in which supplementary patterns having a function to reduce the intensity of light and composed of a diffraction grating pattern or a translucent film is set. In other words, in a photolithography step, thicknesses of a resist mask to be developed are differentiated by adjusting the amount of transmitted light of the photomask in the case where a photo resist is exposed to light. In this case, a resist having the complicated shape may be formed by providing a slit having resolution limit or less in the photomask or the reticle. Further, a mask pattern made of a photo resist material may be deformed by baking at approximately 200° C. after development.

Further, by using the photomask or the reticle, in which a supplementary pattern having a function to reduce the intensity of light and composed of a diffraction grating patterns or a translucent film is set, the region where only the first conductive layer is formed and the region where the first conductive layer and the second conductive layer are stacked can be formed in succession. As shown in FIG. 14A, the region where only the first conductive layer is formed can be selectively formed over the semiconductor layer. Such a region is effective over the semiconductor layer; however, the region is not necessary in a region (a wiring region which is connected to the gate electrode) except for the region. By using the photomask or the reticle, the region of only the first conductive layer does not need to be formed in a wiring portion; therefore, wiring density can be increased substantially.

In the case of FIG. 13 and FIGS. 14A to 14E, the first conductive layer is made of refractory metal such as tungsten (W), chromium (Cr), tantalum (Ta), tantalum nitride (TaN), or molybdenum (Mo); or an alloy or a compound containing refractory metal as its main component, to have a thickness of 30 nm to 50 nm. The second conductive layer is made of refractory metal such as tungsten (W), chromium (Cr), tantalum (Ta), tantalum nitride (TaN), or molybdenum (Mo); or an alloy or a compound containing refractory metal as its main component, to have a thickness of 300 nm to 600 nm. For example, the first conductive layer and the second conductive layer are made of different conductive materials in order to generate a difference in etching rate in an etching step to be conducted later. As one example, TaN can be used for the first conductive layer and a tungsten film can be used for the second conductive layer.

This embodiment shows that transistors each having a different electrode structure, a capacitor element, and a resistor element can be manufactured to be differentiated from each other by using the photomask or the reticle, in which a supplementary pattern having a function to reduce the intensity of light and composed of a diffraction grating pattern or a translucent film is set. According to this, elements having different modes can be formed and integrated without increasing the number of steps.

Embodiment 3

An example of forming a static RAM (SRAM) as one element included in the semiconductor device shown in FIG. 1 is explained with reference to FIGS. 15A to 17B.

Figure 15A:
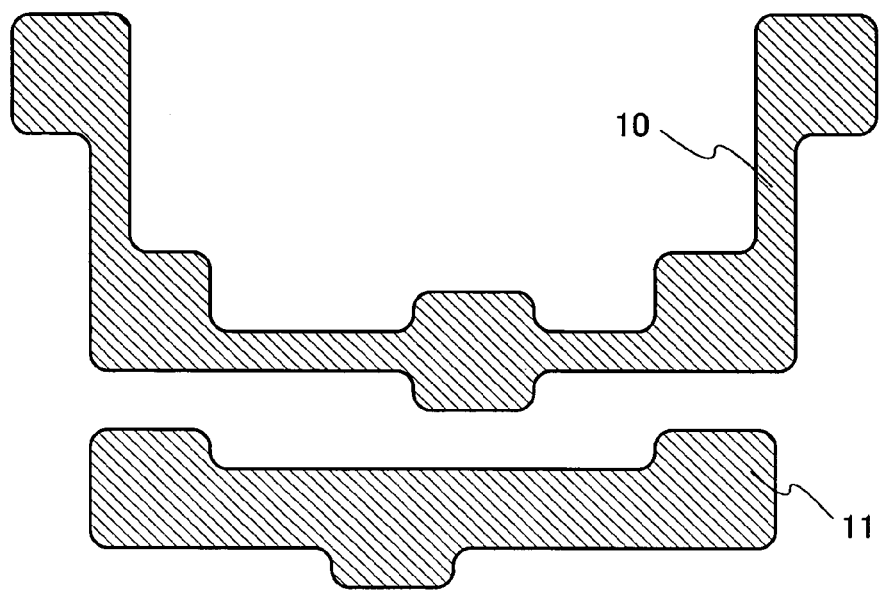
FIGS. 15A and 15B are partial top views of a semiconductor device of the present invention.

Semiconductor layers 10 and 11 shown in FIG. 15A are preferably made of silicon or a crystalline semiconductor containing silicon as its component. For example, a polycrystalline silicon film, a single crystal silicon, or the like which is formed by crystallizing a silicon film by laser annealing or the like is applied. Besides, a metal oxide semiconductor, amorphous silicon, or an organic semiconductor, which shows semiconductor characteristics, can be applied.

In any case, a semiconductor layer which is formed first is formed over the entire surface or part (a region having a larger area than that confirmed as a semiconductor region of a transistor) of a substrate having an insulating surface. Then, a mask pattern is formed over the semiconductor layer by photolithography. Then, the semiconductor layer is etched utilizing the mask pattern to form island-like semiconductor layers 10 and 11 each having a particular shape and including source and drain regions and a channel forming region of a TFT. The semiconductor layers 10 and 11 are determined in view of adequacy of layout.

Figure 15B:
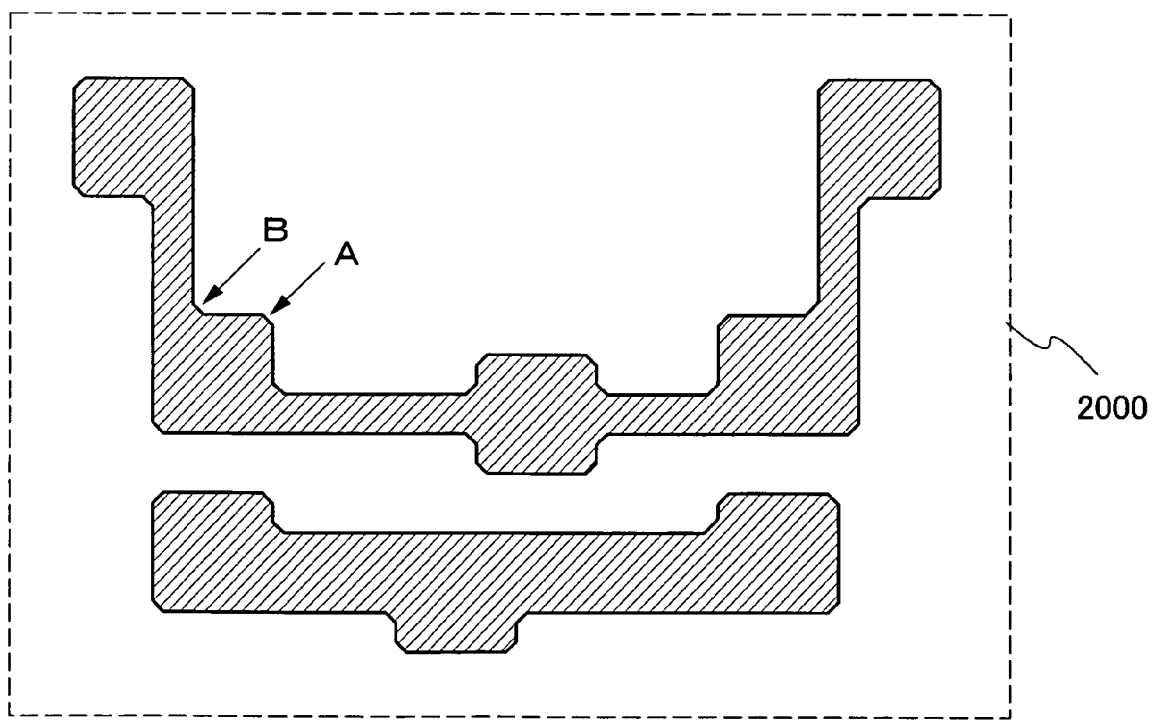

A photomask for forming the semiconductor layers 10 and 11 shown in FIG. 15A is provided with a mask pattern 2000 shown in FIG. 15B. This mask pattern 2000 is different depending on whether a resist used in a photolithography step is a positive type or a negative type. In the case of using the positive type resist, the mask pattern 2000 shown in FIG. 15B is manufactured as a light shielding portion. The mask pattern 2000 has a shape in which a vertex portion A of a polygon is removed. An inside of a corner B has a shape in which its corner portion is bent in multiple degrees so as not to be a right angle. In this pattern of the photomask, an angular portion of the corner portion is removed.

The shape of the mask pattern 2000 shown in FIG. 15B is reflected in the semiconductor layers 10 and 11 shown in FIG. 15A. In that case, although the shape similar to the mask pattern 2000 may be transferred, the transfer may be conducted so that the corner portion of the mask pattern 2000 is further rounded. In other words, a round portion in which the pattern shape is smoothed more than the mask pattern 2000 may be provided.

Figure 16A:
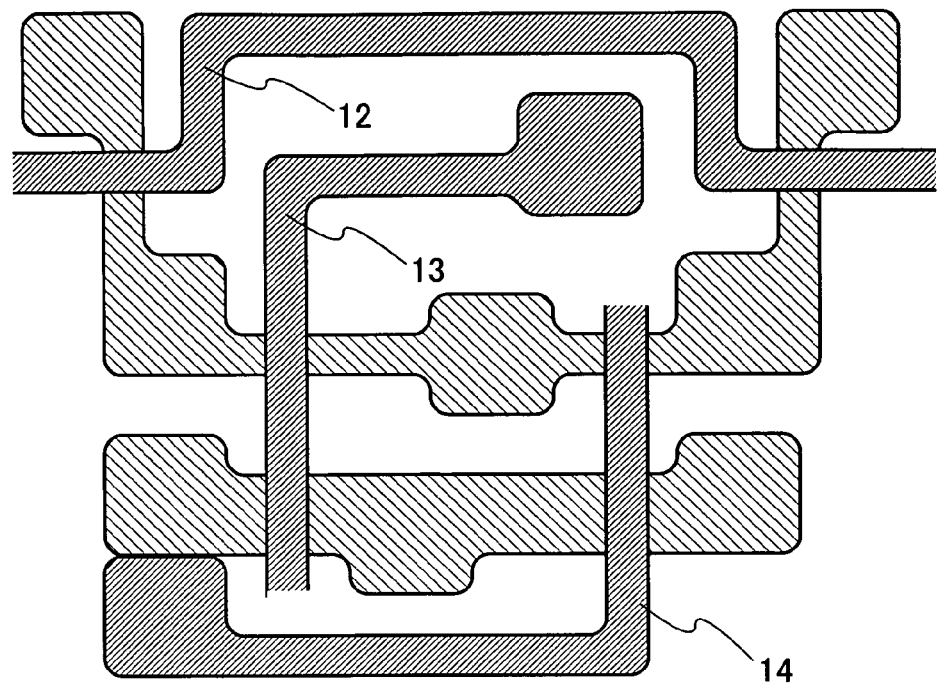
FIGS. 16A and 16B are partial top views of a semiconductor device of the present invention.

An insulating layer including silicon oxide or silicon nitride in at least part of the insulating layer is formed over the semiconductor layers 10 and 11. One of objects for forming this insulating layer is a gate insulating layer. Then, as shown in FIG. 16A, gate wirings 12, 13, and 14 are formed so as to partly overlap with the semiconductor layer. The gate wiring 12 is formed corresponding to the semiconductor layer 10, the gate wiring 13 is formed corresponding to the semiconductor layers 10 and 11, and the gate wiring 14 is formed corresponding to the semiconductor layers 10 and 11. As the gate wiring, a metal layer or a semiconductor layer having high conductivity is formed and the shape thereof is reformed over the insulating layer by photolithography.

Figure 16B:
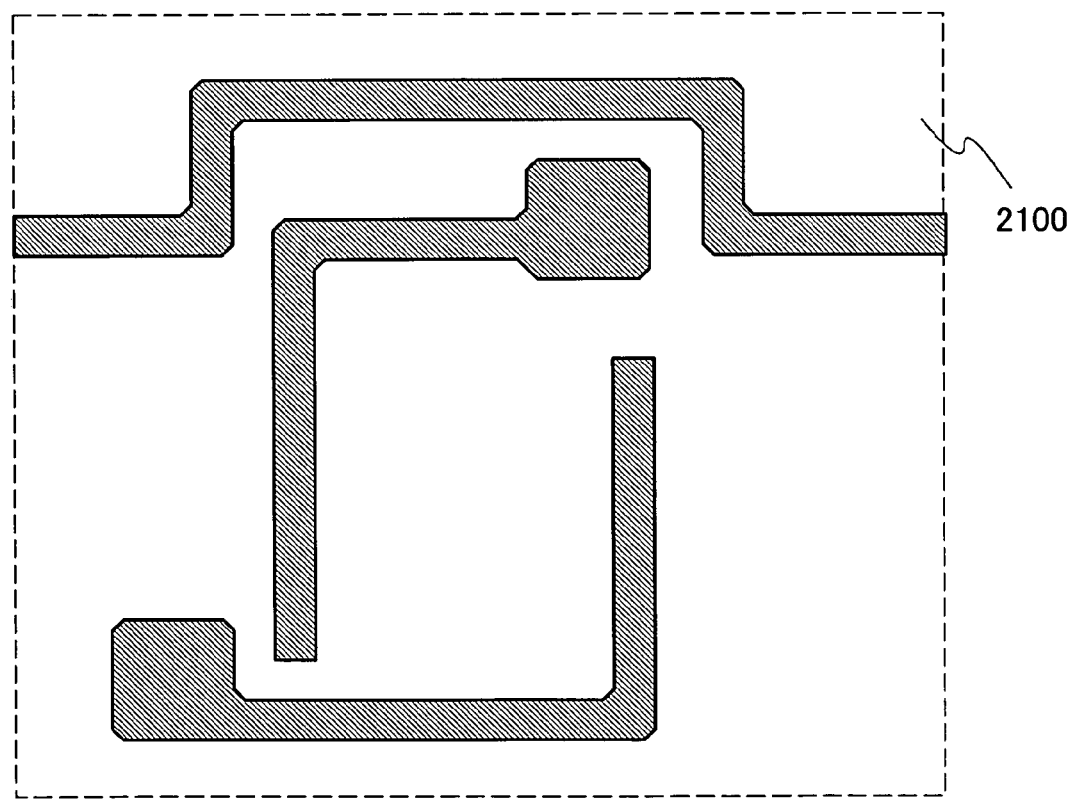

A photomask is provided with a mask pattern 2100 shown in FIG. 16B. In this mask pattern 2100, an angular portion of a corner portion of the mask pattern is removed by a length of a half or less and a fifth or more of the line width of the wiring. The shape of the mask pattern 2100 shown in FIG. 16B is reflected in the gate wirings 12, 13, and 14 shown in FIG. 16A. In that case, although the shape similar to the mask pattern 2100 may be transferred, the transfer may be conducted so that the corner portion of the mask pattern 2100 is further rounded. In other words, a round portion in which the pattern shape is smoothed more than the mask pattern 2100 may be provided in the gate wirings 12, 13 and 14. Outside of the corner portion of the gate wirings 12, 13 and 14 has an effect that the generation of fine powder by abnormal electrical discharge in dry etching using plasma can be suppressed. Inside of the corner portion has an effect in cleaning that even if fine powder is attached to the substrate, it is possible to wash away the fine powder without retention of cleaning solutions in the corner portion of the wiring pattern.

An interlayer insulating layer is a layer formed next to the gate wirings 12, 13, and 14. The interlayer insulating layer is formed with an inorganic insulating material such as silicon oxide or an organic insulating material using polyimide, acrylic resin, or the like. An insulating layer such as silicon nitride or silicon nitride oxide may be interposed between this interlayer insulating layer and the gate wirings 12, 13, and 14. Further, an insulating layer of silicon nitride, silicon nitride oxide, or the like may be provided also over the interlayer insulating layer. According to this insulating layer, the semiconductor layer and the gate insulating layer can be prevented from being contaminated by an impurity such as an extrinsic metal ion or moisture which is not good for a TFT.

Figure 17A:
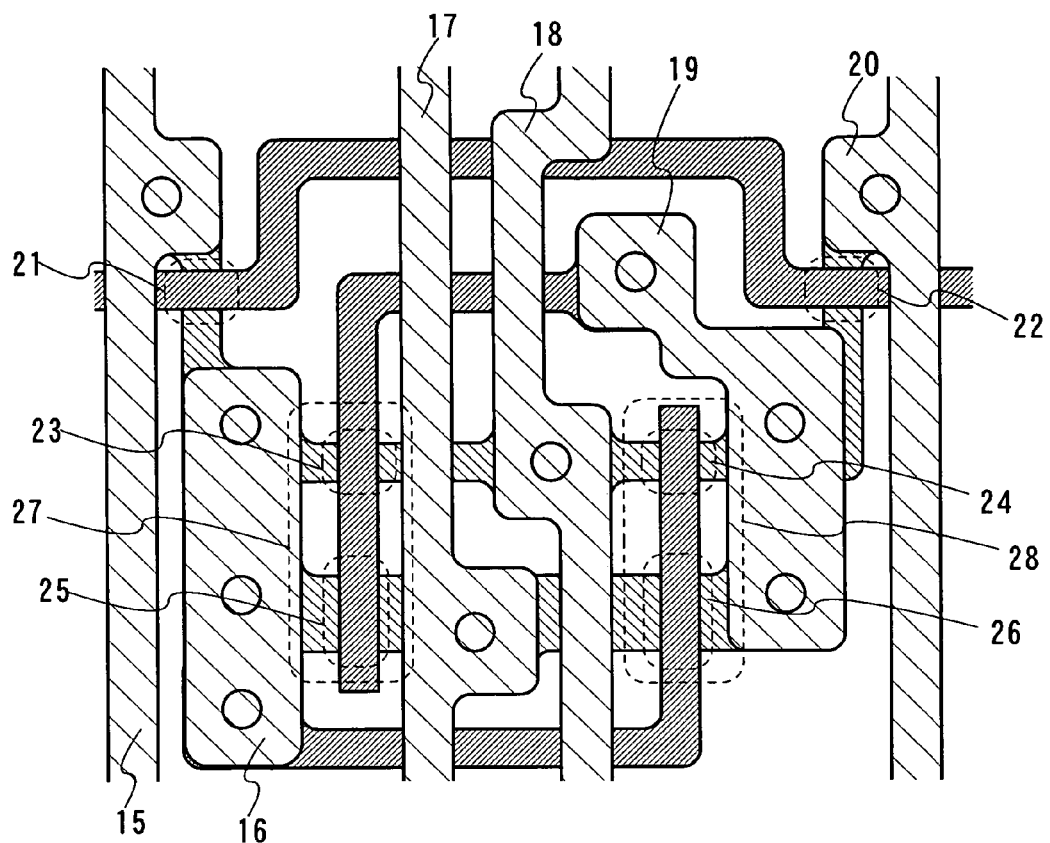
FIGS. 17A and 17B are partial top views of a semiconductor device of the present invention.
Figure 17B:
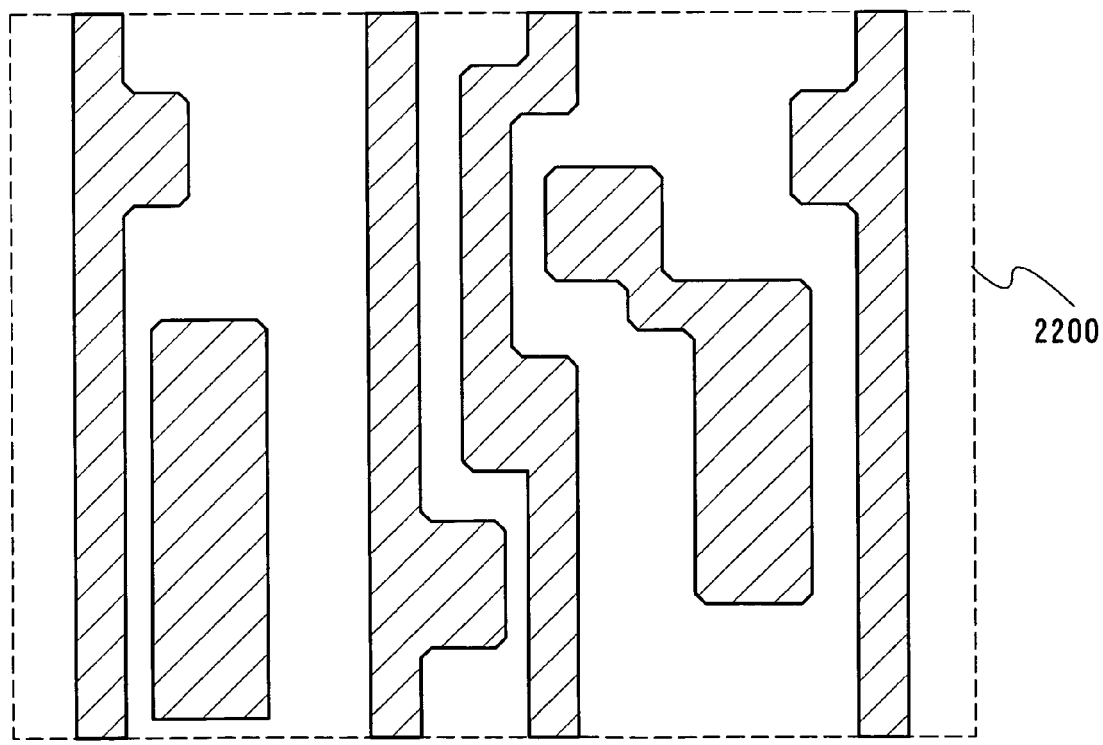

In the interlayer insulating layer, an opening is formed in a predetermined position. For example, the opening is provided corresponding to the gate wiring or semiconductor layer in the lower layer. A mask pattern is formed by photolithography, and a wiring layer formed with one layer or a plurality of layers made of metal or a metal compound is formed in a predetermined pattern by etching process. Accordingly, as shown in FIG. 17A, wirings 15 to 20 are formed so as to partly overlap with the semiconductor layer. The wiring connects particular elements. The wiring connects the particular elements not with a straight line but with a line including a bend portion due to limitation of layout. In addition, a wiring width is changed in a contact portion or the other regions. The wiring width of a contact portion is changed to be widened in a portion where the size of a contact hole is the same as or larger than the wiring width.

A photomask for forming the wirings 15 to 20 is provided with a mask pattern 2200 shown in FIG. 7B. Also in this case, in a corner portion of the wiring, which is bent into an L-shape, respectively, an angular portion of the corner portion is removed so that a side length of a right triangle is 10 μm or less, or a half or less and a fifth or more of the line width of the wiring. Accordingly, the corner portion of the wiring is made to have a rounded pattern. In other words, outer periphery of a wiring layer in the corner portion viewed from above is made to form a curved line. Specifically, part of the wiring layer corresponding to an isosceles right triangle, which is formed with two first straight lines interposing the corner portion and being perpendicular to each other and a second straight line at approximately 45 degrees to these two first straight lines, is removed so that an outer peripheral edge of the corner portion is made to be rounded. When the removal is finished, two obtuse angle portions are newly formed in the wiring layer. The wiring layer is preferably etched so that a curved line, which is in contact with both of the first straight line and the second straight line, is formed in each obtuse angle portion by appropriately conducting a mask design and setting an etching condition. It is to be noted that length of two sides of the isosceles right triangle, which are equal to each other, is made to be a fifth or more and a half or less of the width of the wiring. An inner periphery of the corner portion is also formed to be rounded along the outer periphery of the corner portion. In such a shape of a wiring, the generation of fine powder by abnormal electrical discharge in dry etching using plasma can be suppressed. In cleaning of the substrate, even if fine powder is attached to the substrate, it is possible to wash away the fine powder without retention of cleaning solutions in the corner portion of the wiring pattern. As a result, there is an effect that yield can be improved. This is also advantageous in that when many parallel wirings are provided over the substrate, fine powder attached to the substrate can be easily washed away. In addition, the corner portion of the wiring is rounded, and accordingly, electric conduction can be expected.

In FIG. 17A, n-channel transistors 21 to 24, and p-channel transistors 25 and 26 are formed. Inverters include the n-channel transistor 23 and p-channel transistor 25, and the n-channel transistor 24 and p-channel transistor 26, respectively. A circuit including these six transistors forms SRAM. As an upper layer of these transistors, an insulating layer made of silicon nitride, silicon oxide, or the like may be formed.

This application is based on Japanese Patent Application Ser. No. 2005-158187 filed in Japan Patent Office on May 30, 2005, the contents of which are hereby incorporated by reference.

What is claimed is:

1. A semiconductor device comprising:
   a substrate;
   a circuit including a thin film element formed over the substrate;
   a first insulating film formed over the circuit;
   a first antenna formed over the first insulating film;
   a second insulating film formed over the first antenna; and
   a second antenna formed over the second insulating film,
   wherein the first antenna and the second antenna are electrically connected to each other, and
   the first antenna is electrically connected to a source or drain wiring connected to the thin film element.

2. A semiconductor device according to claim 1, wherein the thin film element includes a thin film transistor including a semiconductor layer, a gate insulating film, and a gate electrode,
   the circuit is electrically connected to the first antenna, and
   a wiring connecting the circuit and the first antenna is formed of the same material and in the same layer as the gate electrode of the thin film transistor.

3. A semiconductor device according to claim 2, wherein the gate electrode is formed using at least one selected from the group consisting of tantalum, tungsten, titanium, molybdenum, aluminum, copper, chromium, and niobium or an alloy or a compound containing one or a plurality of them.

4. A semiconductor device according to claim 1, wherein the first antenna is formed using at least one selected from the group consisting of aluminum, nickel, tungsten, molybdenum, titanium, platinum, copper, tantalum, gold, and manganese or an alloy or a compound containing one or a plurality of them.

5. A semiconductor device according to claim 1, wherein the second antenna is formed using at least one selected from the group consisting of aluminum, nickel, tungsten, molybdenum, titanium, platinum, copper, tantalum, gold, and manganese or an alloy or a compound containing one or a plurality of them.

6. A semiconductor device according to claim 1, wherein the first antenna is arranged to surround the circuit.

7. A semiconductor device according to claim 1, wherein the circuit is arranged outside the first antenna.

8. A semiconductor device according to claim 1, wherein the first antenna and the second antenna comprise resonance capacitor portions.

9. A semiconductor device comprising:
   a substrate;
   a circuit including a thin film element formed over the substrate;
   a first insulating film formed over the circuit;
   a first antenna formed over the first insulating film;
   a second insulating film formed over the first antenna; and
   a second antenna formed over the second insulating film,
   wherein the first antenna and the second antenna are partially electrically connected to each other,
   the first antenna is electrically connected to a source or drain wiring connected to the thin film element, and
   the first antenna and the second antenna are formed so as not to overlap each other except in an intersecting portion and an electrically connecting portion when seen from a direction perpendicular to the substrate.

10. A semiconductor device according to claim 9, wherein the thin film element includes a thin film transistor including a semiconductor layer, a gate insulating film, and a gate electrode,
    the circuit is electrically connected to the first antenna, and
    a wiring connecting the circuit and the first antenna is formed of the same material and in the same layer as the gate electrode of the thin film transistor.

11. A semiconductor device according to claim 10, wherein the gate electrode is formed using at least one selected from the group consisting of tantalum, tungsten, titanium, molybdenum, aluminum, copper, chromium, and niobium or an alloy or a compound containing one or a plurality of them.

12. A semiconductor device according to claim 9, wherein the first antenna is formed using at least one selected from the group consisting of aluminum, nickel, tungsten, molybdenum, titanium, platinum, copper, tantalum, gold, and manganese or an alloy or a compound containing one or a plurality of them.

13. A semiconductor device according to claim 9, wherein the second antenna is formed using at least one selected from the group consisting of aluminum, nickel, tungsten, molybdenum, titanium, platinum, copper, tantalum, gold, and manganese or an alloy or a compound containing one or a plurality of them.

14. A semiconductor device according to claim 9, wherein the first antenna is arranged to surround the circuit.

15. A semiconductor device according to claim 9, wherein the circuit is arranged outside the first antenna.

16. A semiconductor device according to claim 9, wherein the first antenna and the second antenna comprise resonance capacitor portions.

17. A semiconductor device comprising:
a circuit including a transistor;
a first insulating film formed over the circuit;
a first antenna formed over the first insulating film;
a second insulating film formed over the first antenna; and
a second antenna formed over the second insulating film,
wherein the first antenna and the second antenna are electrically connected to each other, and
the first antenna is electrically connected to a source or drain wiring connected to the transistor.

18. A semiconductor device according to claim 17, wherein the transistor includes a semiconductor layer, a gate insulating film, and a gate electrode,
the circuit is electrically connected to the first antenna, and
a wiring connecting the circuit and the first antenna is formed of the same material and in the same layer as the gate electrode of the transistor.

19. A semiconductor device according to claim 18, wherein the gate electrode is formed using at least one selected from the group consisting of tantalum, tungsten, titanium, molybdenum, aluminum, copper, chromium, and niobium or an alloy or a compound containing one or a plurality of them.

20. A semiconductor device according to claim 17, wherein the first antenna is formed using at least one selected from the group consisting of aluminum, nickel, tungsten, molybdenum, titanium, platinum, copper, tantalum, gold, and manganese or an alloy or a compound containing one or a plurality of them.

21. A semiconductor device according to claim 17, wherein the second antenna is formed using at least one selected from the group consisting of aluminum, nickel, tungsten, molybdenum, titanium, platinum, copper, tantalum, gold, and manganese or an alloy or a compound containing one or a plurality of them.

22. A semiconductor device according to claim 17, wherein the first antenna is arranged to surround the circuit.

23. A semiconductor device according to claim 17, wherein the circuit is arranged outside the first antenna.

24. A semiconductor device according to claim 17, wherein the first antenna and the second antenna comprise resonance capacitor portions.

25. A semiconductor device according to claim 17, wherein the transistor is a thin film transistor.

26. A semiconductor device comprising:
a circuit including a transistor;
a first insulating film formed over the circuit;
a first antenna formed over the first insulating film;
a second insulating film formed over the first antenna; and
a second antenna formed over the second insulating film,
wherein the first antenna and the second antenna are electrically connected to each other,
the first antenna is electrically connected to a source or drain wiring connected to the transistor, and
the first antenna and the second antenna are formed so as not to overlap each other except in an intersecting portion and an electrically connecting portion when seen from a direction perpendicular to the circuit.

27. A semiconductor device according to claim 26, wherein the transistor includes a semiconductor layer, a gate insulating film, and a gate electrode,
the circuit is electrically connected to the first antenna, and
a wiring connecting the circuit and the first antenna is formed of the same material and in the same layer as the gate electrode of the transistor.

28. A semiconductor device according to claim 27, wherein the gate electrode is formed using at least one selected from the group consisting of tantalum, tungsten, titanium, molybdenum, aluminum, copper, chromium, and niobium or an alloy or a compound containing one or a plurality of them.

29. A semiconductor device according to claim 26, wherein the first antenna is formed using at least one selected from the group consisting of aluminum, nickel, tungsten, molybdenum, titanium, platinum, copper, tantalum, gold, and manganese or an alloy or a compound containing one or a plurality of them.

30. A semiconductor device according to claim 26, wherein the second antenna is formed using at least one selected from the group consisting of aluminum, nickel, tungsten, molybdenum, titanium, platinum, copper, tantalum, gold, and manganese or an alloy or a compound containing one or a plurality of them.

31. A semiconductor device according to claim 26, wherein the first antenna is arranged to surround the circuit.

32. A semiconductor device according to claim 26, wherein the circuit is arranged outside the first antenna.

33. A semiconductor device according to claim 26, wherein the first antenna and the second antenna comprise resonance capacitor portions.

34. A semiconductor device according to claim 26, wherein the transistor is a thin film transistor.

* * * * *